(12) United States Patent
Kawase

(10) Patent No.: US 9,746,497 B2
(45) Date of Patent: Aug. 29, 2017

(54) METHOD OF DETECTING MAGNETIC FIELD GENERATED FROM CURRENT AND ESTIMATING CURRENT AMOUNT

(75) Inventor: Masahiro Kawase, Higashimatsuyama (JP)

(73) Assignee: Canon Denshi Kabushiki Kaisha, Chichibu-shi (JP)

( * ) Notice: Subject to any disclaimer, the term of this patent is extended or adjusted under 35 U.S.C. 154(b) by 954 days.

(21) Appl. No.: 13/604,022

(22) Filed: Sep. 5, 2012

(65) Prior Publication Data

US 2012/0326716 A1 Dec. 27, 2012

Related U.S. Application Data

(63) Continuation of application No. PCT/JP2011/001625, filed on Mar. 18, 2011.

(30) Foreign Application Priority Data

Mar. 26, 2010 (JP) ................................. 2010-071362
Oct. 25, 2010 (JP) ................................. 2010-238564

(51) Int. Cl.
*G01R 19/20* (2006.01)
*G01R 15/14* (2006.01)
*G01R 33/02* (2006.01)

(52) U.S. Cl.
CPC ........... *G01R 15/148* (2013.01); *G01R 33/02* (2013.01)

(58) Field of Classification Search
CPC .... G01R 33/02; G01R 15/148; G01R 15/207; G01R 33/04; G01R 33/063; G01R 33/09;
(Continued)

(56) References Cited

U.S. PATENT DOCUMENTS 5,041,780 A * 8/1991 Rippel ................. G01R 15/207
324/117 H
6,271,656 B1 8/2001 Juds et al.
(Continued)

FOREIGN PATENT DOCUMENTS

CN 101131374 A 2/2008
DE 10110254 A1 9/2002
(Continued)

OTHER PUBLICATIONS

Chinese Office Action dated Mar. 4, 2014 issued in corresponding Chinese Patent Application No. 201180016327.2.
(Continued)

*Primary Examiner* — Vinh Nguyen
(74) *Attorney, Agent, or Firm* — Fitzpatrick, Cella, Harper & Scinto

(57) ABSTRACT

When a through hole is formed in a primary conductor, a measurement target current partially becomes a bypass current that flows around the through hole. Only a magnetic field component in the X-axis direction is generated from the current that flows through a portion without the influence of the through hole. However, the bypass current generates a magnetic field component in the Y-axis direction at the tilt portion. A magnetic detection element having a magnetic field detection sensitivity only in the Y-axis direction is installed near the through hole such that the magnetic field detection direction is set in the Y-axis direction, thereby detecting the magnetic field component and measuring the current amount without the influence of a neighboring current.

22 Claims, 26 Drawing Sheets

(58) Field of Classification Search
CPC .. G01R 19/0092; G01R 19/20; G01R 33/093; G01R 33/12; G01R 15/202; G01R 19/00; G01R 21/06; G01N 27/72; G01N 27/82; G01N 27/9033
See application file for complete search history.

(56) References Cited

U.S. PATENT DOCUMENTS

| | | | |
|---|---|---|---|
| 6,456,068 B1 | 9/2002 | Kawase | |
| 6,459,255 B1 | 10/2002 | Tamai et al. | |
| 6,512,359 B1* | 1/2003 | Tamai | G01R 15/207 324/117 H |
| 6,642,705 B2 | 11/2003 | Kawase | |
| 6,897,649 B2 | 5/2005 | Kawase | |
| 6,989,666 B2 | 1/2006 | Kawase | |
| 7,375,507 B2 | 5/2008 | Racz et al. | |
| 7,816,025 B2 | 10/2010 | Kubo et al. | |
| 2004/0053425 A1 | 3/2004 | Link et al. | |
| 2010/0045286 A1* | 2/2010 | Hotz | G01R 15/207 324/260 |

FOREIGN PATENT DOCUMENTS

| | | |
|---|---|---|
| JP | 2001-264361 A | 9/2001 |
| JP | 2002-107383 A | 4/2002 |
| JP | 2002-516396 A | 6/2002 |
| JP | 2006-184269 A | 7/2006 |
| JP | 2007-121283 A | 5/2007 |
| WO | 99/60416 A1 | 11/1999 |
| WO | 2008/030129 A2 | 3/2008 |

OTHER PUBLICATIONS

Search Report dated Apr. 28, 2017, in European Patent Application No. 11758995.2.

* cited by examiner

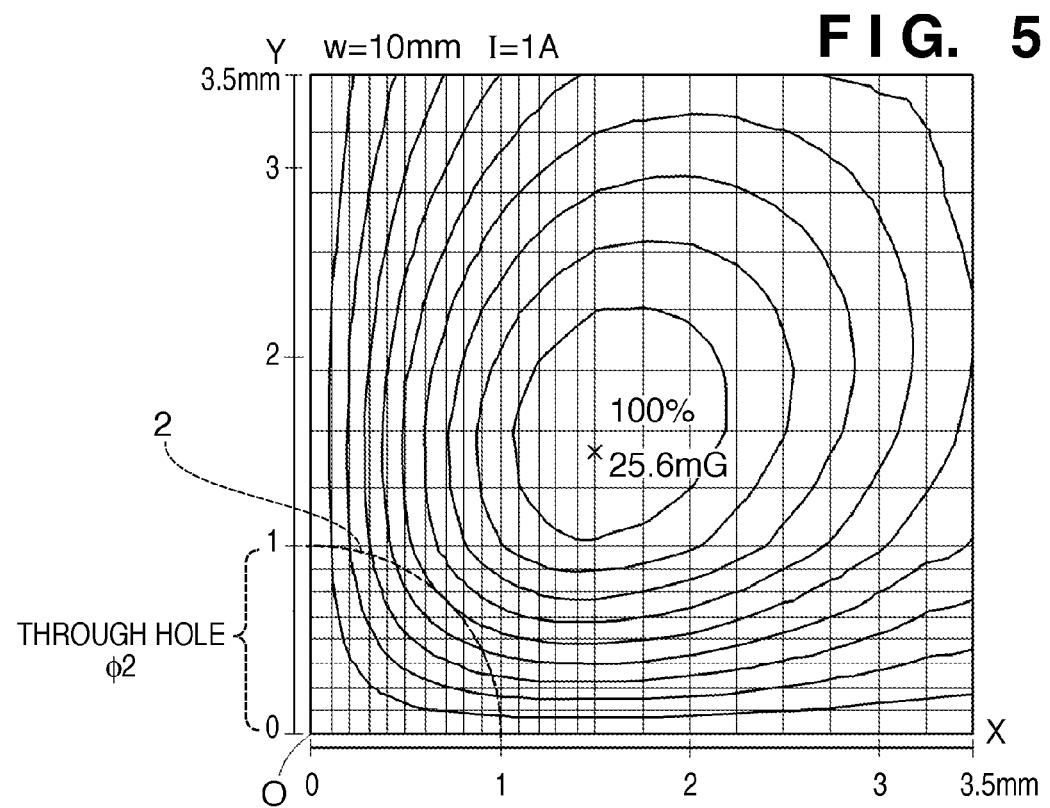
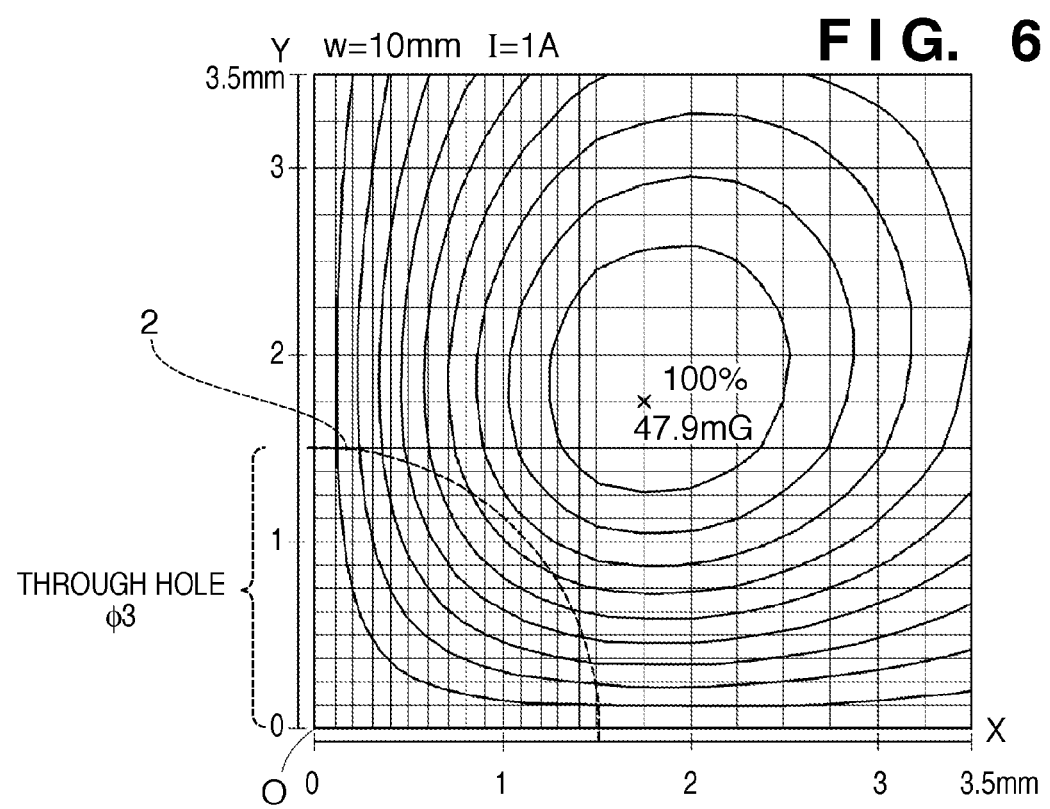

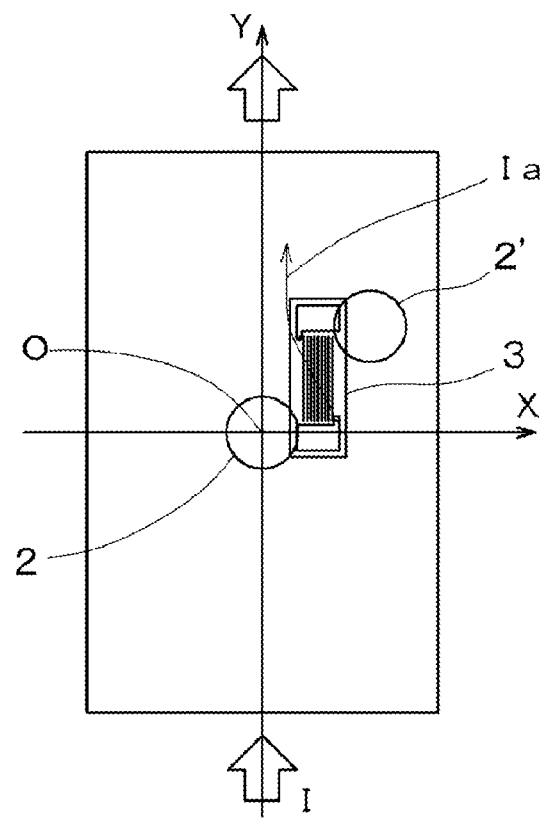
F I G. 9
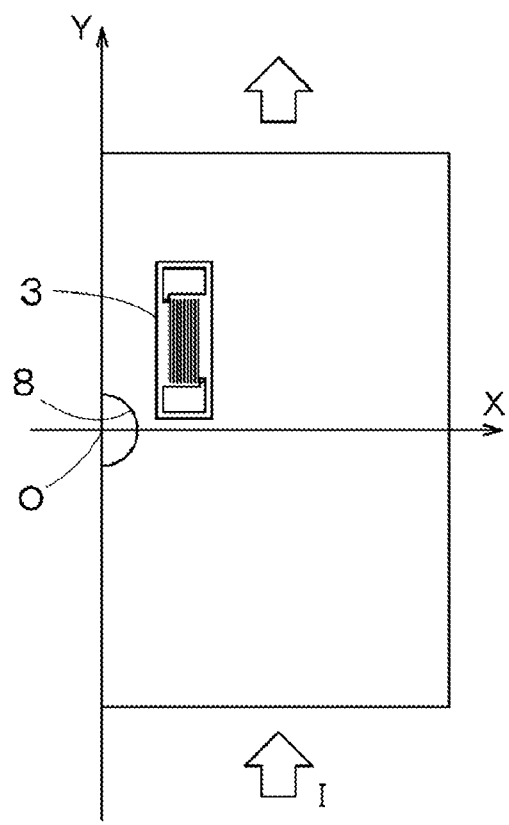
F I G. 10

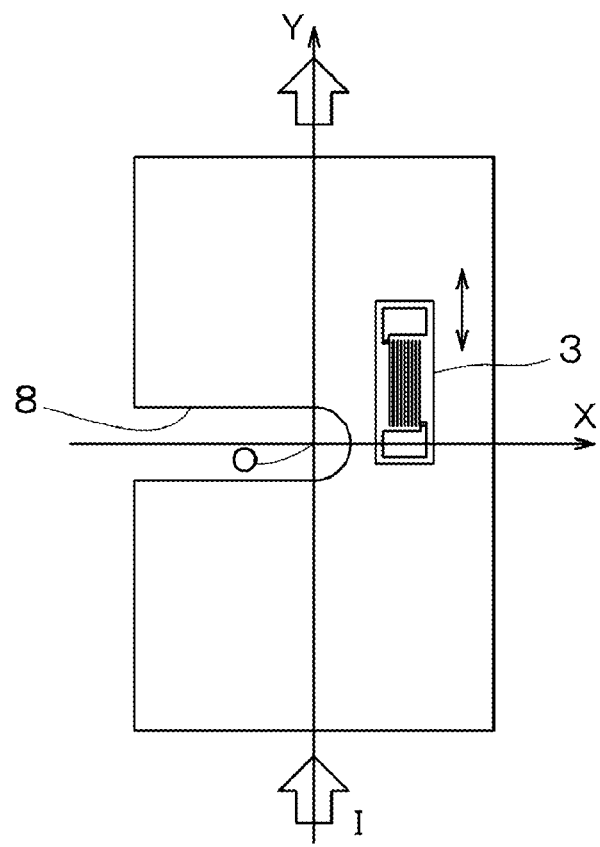
F I G. 11
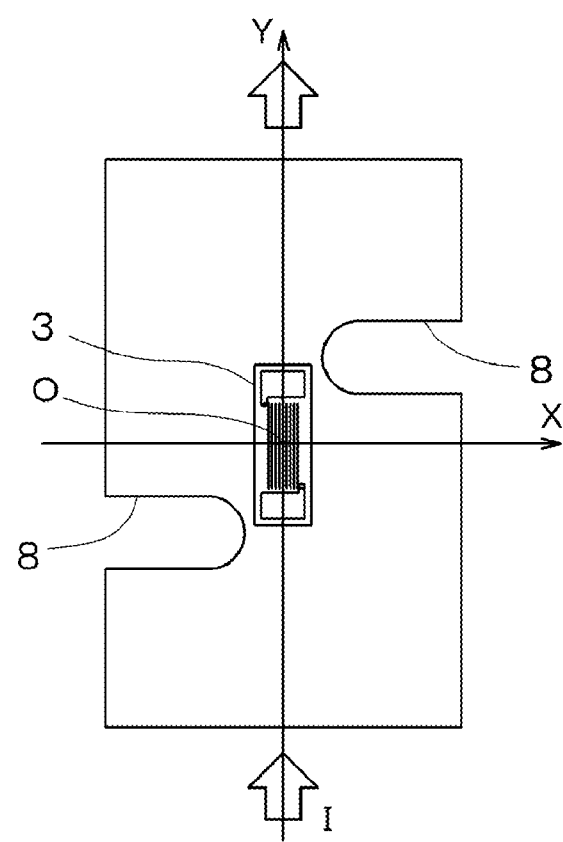
F I G. 12

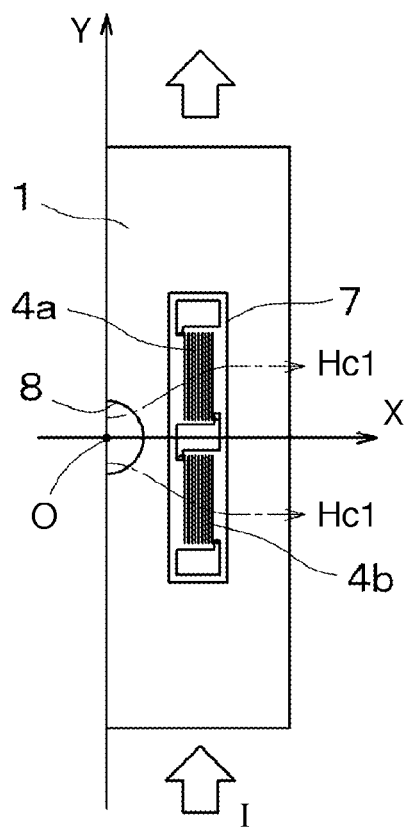
F I G. 23
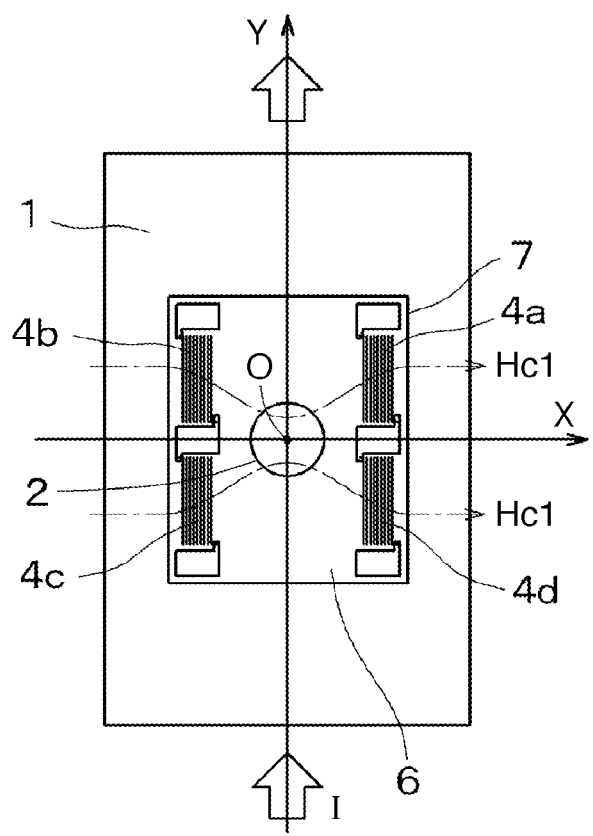
F I G. 24

F I G. 26
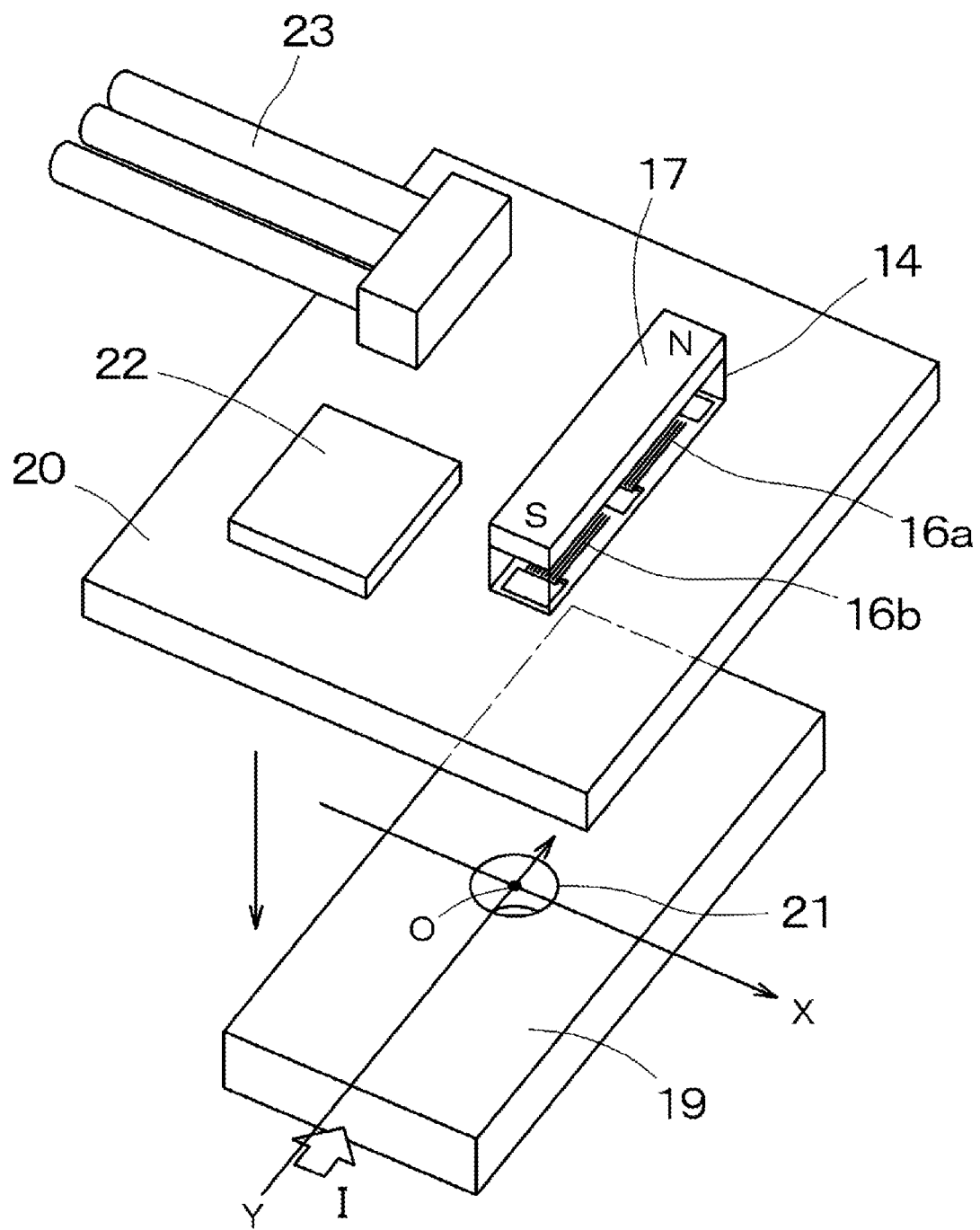

F I G. 28
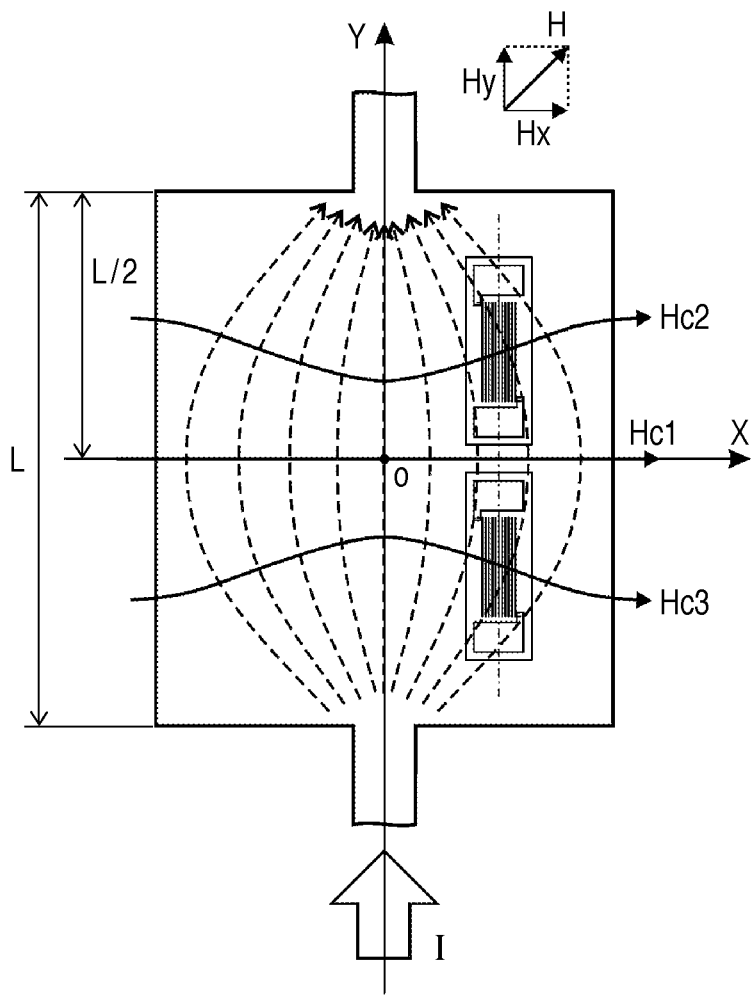
F I G. 29
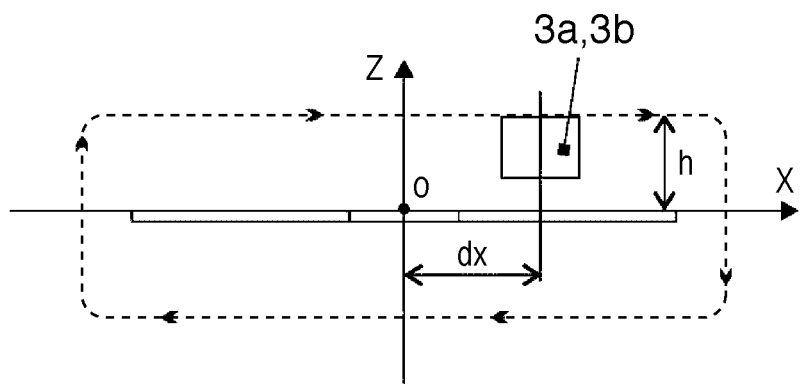

F I G. 30A
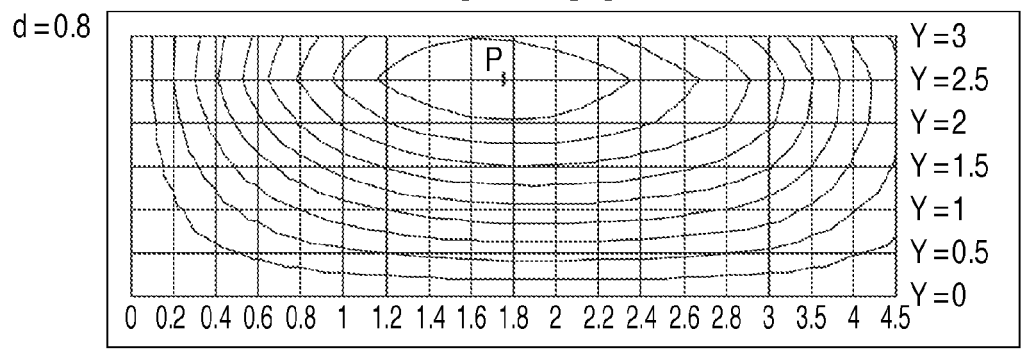
F I G. 30B
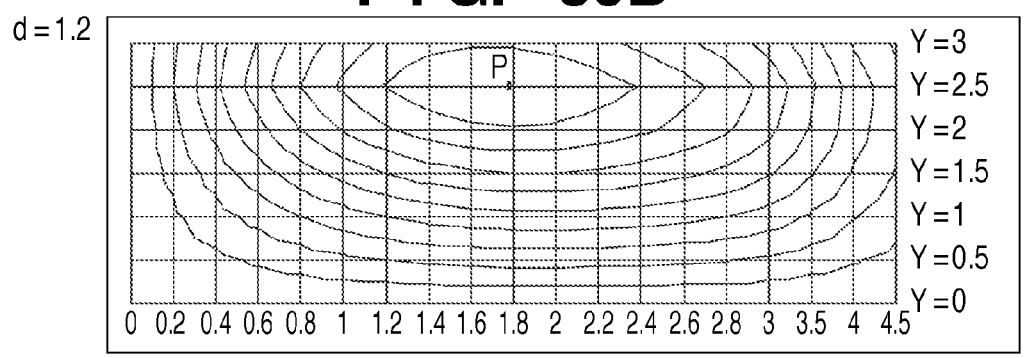
F I G. 30C
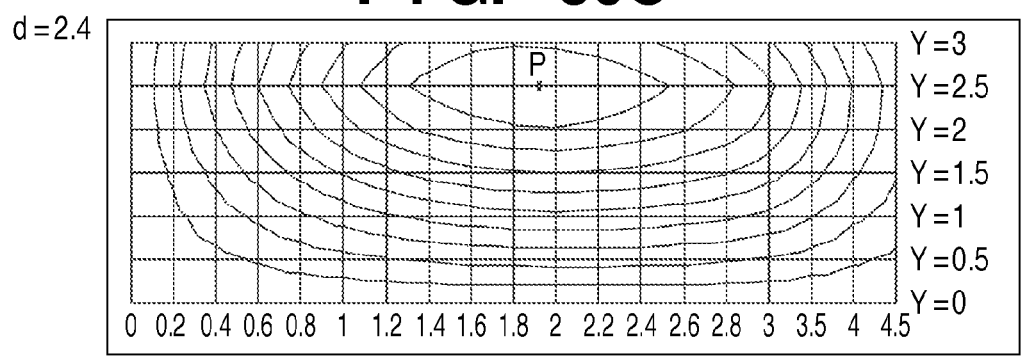
F I G. 30D
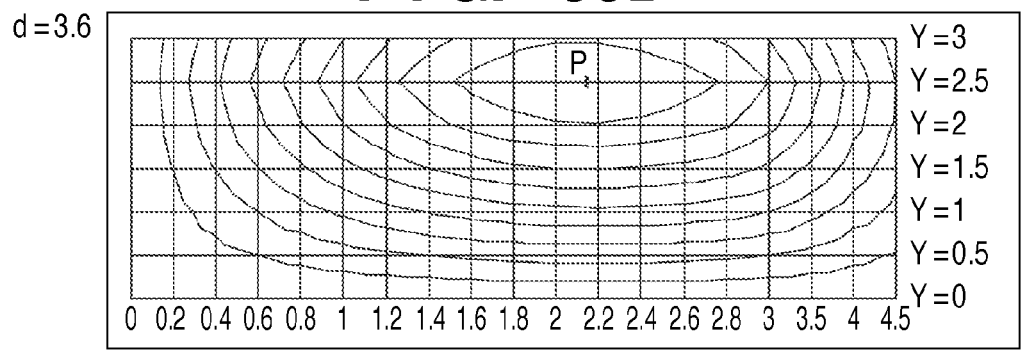

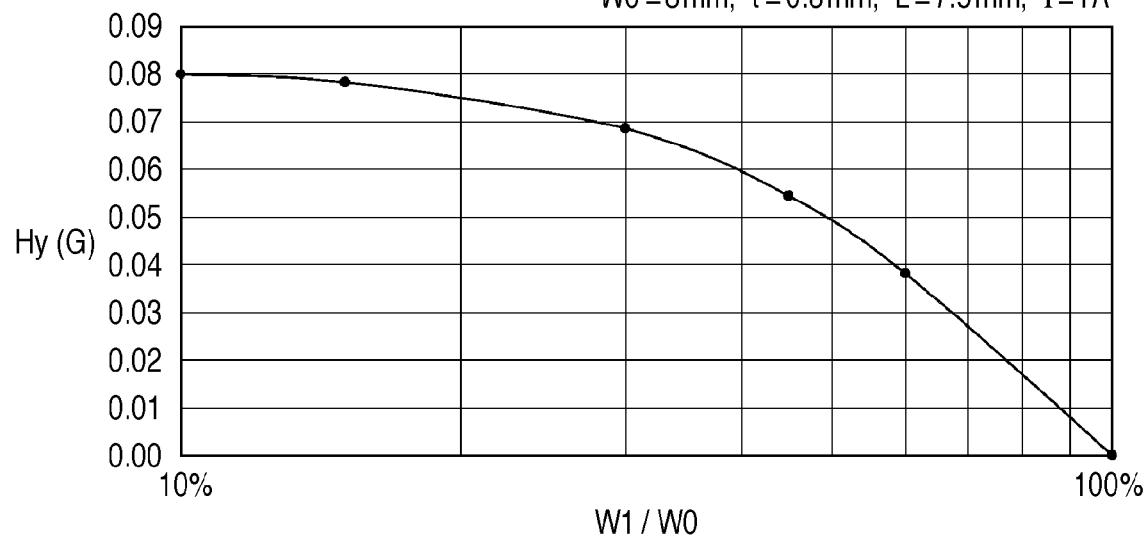

METHOD OF DETECTING MAGNETIC FIELD GENERATED FROM CURRENT AND ESTIMATING CURRENT AMOUNT

BACKGROUND OF THE INVENTION

Field of the Invention

The present invention relates to a current measurement method and current measurement device for detecting a magnetic field near a primary conductor to which a measurement target current flows, thereby obtaining the amount of the measurement target current.

Description of the Related Art

For current measurement, there has conventionally been proposed a current sensor that causes a sensitive magnetic detection element to detect a revolving magnetic field by a measurement target current near a primary conductor to which the measurement target current is applied.

For example, Japanese Patent Laid-Open No. 2001-264361 discloses a compact current sensor configured to cause one sensitive magnetic detection element (MI element) to detect a revolving magnetic field by a current flowing to a primary conductor.

In this arrangement, if the electric wire to which the measurement target current flows is isolated, no problem arises. However, if currents of adjacent phases flow in parallel, as in, for example, a three-phase power supply, magnetic fields by the adjacent currents are superimposed, and the measurement accuracy degrades.

To avoid this influence, generally, a magnetic shield is generally provided by surrounding the magnetic detection element with a magnetic material such as Permalloy. However, the magnetic shield may form a magnetic circuit and distort a magnetic field from a current, and it is difficult to completely cope with the problem.

CITATION LIST

Patent Literature

PTL1: Japanese Patent Laid-Open No. 2001-264361

SUMMARY OF THE INVENTION

Technical Problem

When the magnetic detection element directly detects the revolving magnetic field generated from the current flowing to the primary conductor, as in Japanese Patent Laid-Open No. 2001-264361, the following problem arises. That is, assume that another primary conductor to which a current in a different phase flows is arranged in parallel adjacent to the primary conductor to which the measurement target current flows. When a revolving magnetic field that is a component in a direction perpendicular to the current flowing direction is to be detected, a magnetic field from the adjacent current line is added so no sufficient measurement accuracy is obtained. Even if the interference is prevented by a magnetic shield, the magnetic flux from the measurement target current may distort the magnetic field itself, or the shield member may cause magnetic saturation. It is therefore difficult to take an effective countermeasure.

It is an object of the present invention to solve the above-described problem and provide a current measurement method and current measurement device capable of stably ensuring the measurement accuracy of a measurement target current without depending on a magnetic shield even in an installation environment where currents in different phases flow in parallel.

Solution to Problem

According to the present invention, a direction change area that changes the flowing direction of a measurement target current from the main direction to another direction is provided at part of a conductor to which the measurement target current flows. At least one magnetic detection element is arranged on the conductor. The magnetic detection element detects a magnetic field generated by the measurement target current whose flowing direction is changed by the direction change area. The amount of the measurement target current is estimated from the output of the magnetic detection element.

Other features and advantages of the present invention will be apparent from the following descriptions taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 5 is a distribution contour map of a Y-axis magnetic field component using a through hole having a diameter of 2 mm;

FIG. 6 is a distribution contour map of a Y-axis magnetic field component using a through hole having a diameter of 3 mm;

FIG. 9 is a view showing the arrangement of a modification;

FIG. 10 is a view showing the arrangement of another modification;

FIG. 11 is a view showing the arrangement of still another modification;

FIG. 12 is a view showing the arrangement of still another modification;

FIG. 23 is a view showing the arrangement of a modification;

FIG. 24 is a view showing the arrangement of another modification;

FIG. 26 is a perspective view showing the arrangement of a modification;

FIG. 28 is an explanatory view of the state of a current and a magnetic field in a primary conductor;

FIG. 29 is a sectional view showing the relationship between the primary conductor and a magnetic detection element;

FIG. 30A is a distribution contour map of a Y-axis magnetic field component when the width of a current inlet/outlet is changed;

FIG. 30B is a distribution contour map of a Y-axis magnetic field component when the width of the current inlet/outlet is changed;

FIG. 30C is a distribution contour map of a Y-axis magnetic field component when the width of the current inlet/outlet is changed;

FIG. 30D is a distribution contour map of a Y-axis magnetic field component when the width of the current inlet/outlet is changed;

FIG. 31 is a graph showing the relationship between the width of the current inlet/outlet and the peak value of the Y-axis magnetic field component;

DESCRIPTION OF THE EMBODIMENTS

The present invention will be described in detail based on the illustrated embodiments. As one characteristic feature of the present invention, a direction change area that changes the flowing direction of a measurement target current from the main direction to another direction is provided at part of a conductor to which the measurement target current flows. As another characteristic feature of the present invention, a magnetic detection element detects a magnetic field generated by the measurement target current whose flowing direction is changed by the direction change area.

<First Embodiment>

Figure 1:
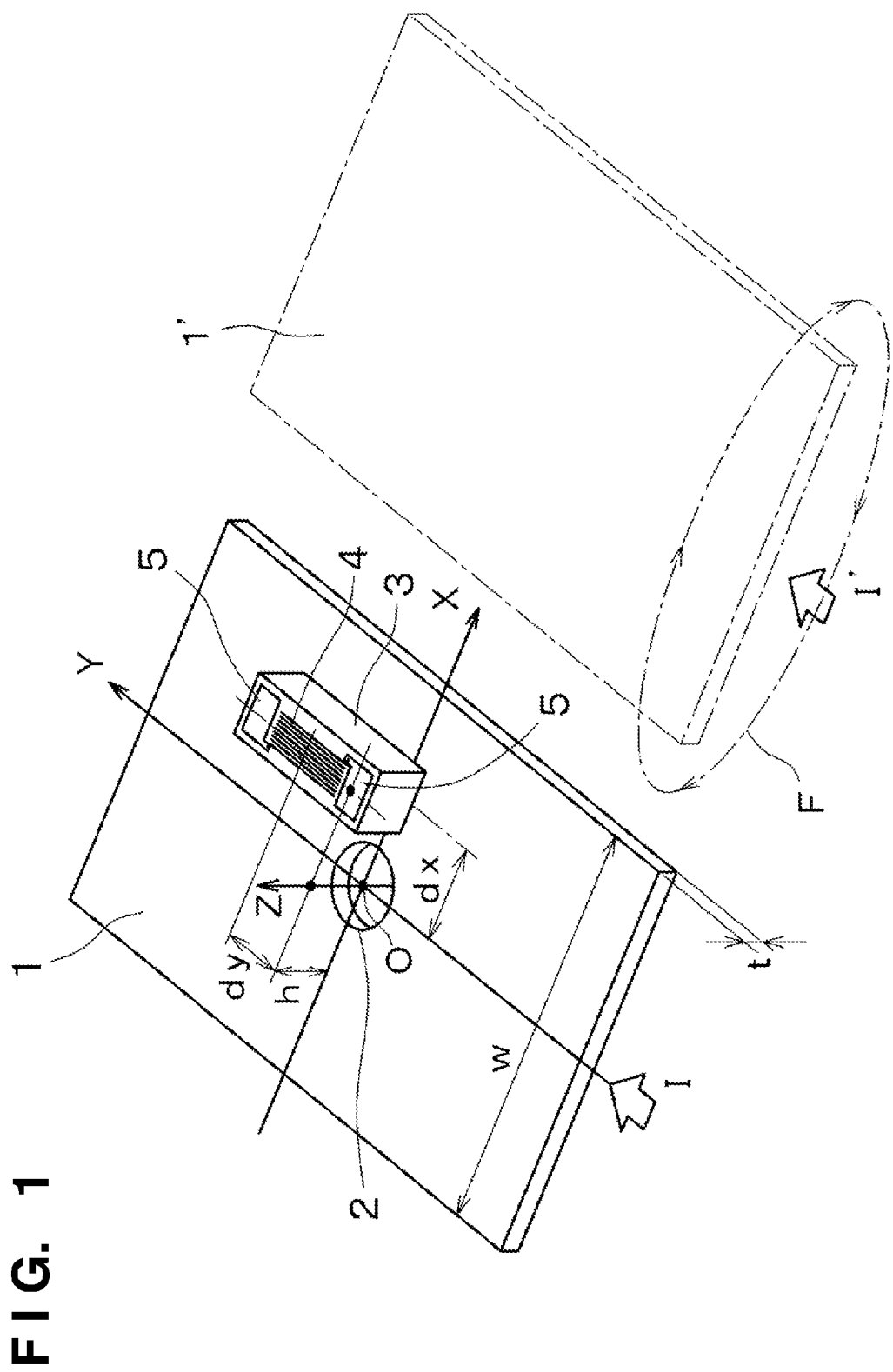
FIG. 1 is a perspective view showing the arrangement of the first embodiment.

FIG. 1 is a perspective view showing the basic arrangement of the first embodiment in which a measurement target current is measured. A measurement target current I to be detected flows to a primary conductor 1. The primary conductor 1 has a form of, for example, a copper foil pattern on a printed board or a bus bar formed from a copper plate.

Figure 2:
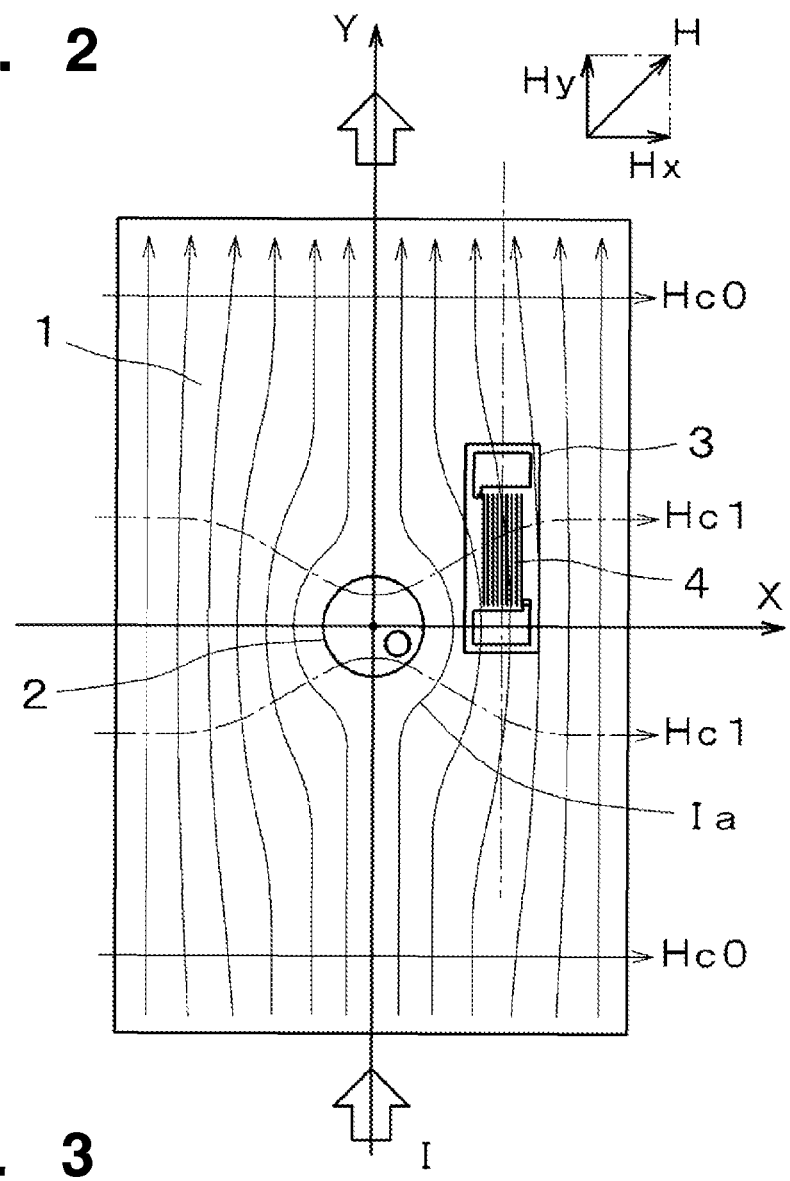
FIG. 2 is an explanatory view of the state of a current and a magnetic field in a primary conductor.

A circular through hole 2 that is a nonconductive area is provided at almost the center of the primary conductor 1 to partially cut off the current. Hence, the measurement target current I partially becomes a bypass current Ia that symmetrically flows around outside on both sides of the through hole 2, as shown in FIG. 2. For the descriptive convenience, coordinate axes are set for the primary conductor 1. Setting an origin O at the center of the through hole 2, the main direction in which the measurement target current I flows is defined as the Y-axis, the widthwise direction perpendicular to the main direction is defined as the X-axis, and the direction of thickness is defined as the Z-axis.

A magnetic detection element 3 having a magnetic field detection sensitivity only in one direction is arranged on the primary conductor 1. The magnetic field detection direction of a detection portion 4 of the magnetic detection element 3 is set in the Y-axis direction. The center of the detection portion 4 is shifted from the center of the through hole 2 by a distance dx in the X-axis direction and dy in the Y-axis direction while sandwiching the X-axis.

A magnetic flux generated by a current is originally directed in a direction perpendicular to the current direction. For this reason, at a position where the through hole 2 of the primary conductor 1 does not affect, the measurement target current I flows in the Y-axis direction that is the main direction. Hence, the magnetic field has only a vector component Hx in the X-axis direction within a width w of the primary conductor 1, like a magnetic field vector component Hc0 shown in FIG. 2.

However, since the bypass current Ia tilts with respect to the Y-axis direction near the through hole 2, the bypass current Ia generates magnetic field vector components Hc1 of the distorted magnetic field on both sides of the through hole 2. That is, a vector component Hy in the Y-axis direction and the vector component Hx in the X-axis direction are generated at the tilt portion of the bypass current Ia. The vector sum of the vector component Hy and the vector component Hx is proportional to the magnitude of the measurement target current I. The current direction is symmetric on the positive and negative sides of the Y-axis of the through hole 2. Hence, the vector components Hy are symmetric about the X-axis and have opposite polarities on both sides of the X-axis.

Even when a primary conductor 1' to which a current in a different phase flows is in the neighborhood, and the direction of a neighboring current I' is parallel to that of the measurement target current I, as shown in FIG. 1, the magnetic field generated by the neighboring current I' has only a vector component in the X-axis direction and no component in the Y-axis direction. When the magnetic field detection direction of the detection portion 4 is the Y-axis direction, the magnetic detection element 3 can detect only the vector component Hy of the bypass current Ia without any interference with the magnetic field by the neighboring current I'. It is therefore possible to obtain the amount of the measurement target current I by calibrating and converting the vector component Hy.

Since it is not preferable to detect the magnetic field vector component Hx in the X-axis direction, a magnetic impedance element or orthogonal fluxgate element having high directivity is suitable as the magnetic detection element 3. In the first embodiment, a magnetic impedance element is used, and a magnetic field can be detected only in the Y-axis direction. In the detection portion 4, thin magnetic film patterns are juxtaposed to form a meandering pattern in the Y-axis direction that is the magnetic field detection direction. A high-frequency pulse in the MHz band is applied to electrodes 5 at the two ends. A change in the voltage amplitude from the two terminals of the detection portion 4 caused by a change in the magnetic field is obtained as a sensor signal. Although not illustrated, some operations of the detection portion 4 need a bias magnetic field which is set as needed by installing a bias magnet in the vicinity or winding a bias coil and supplying a current.

Figure 3:
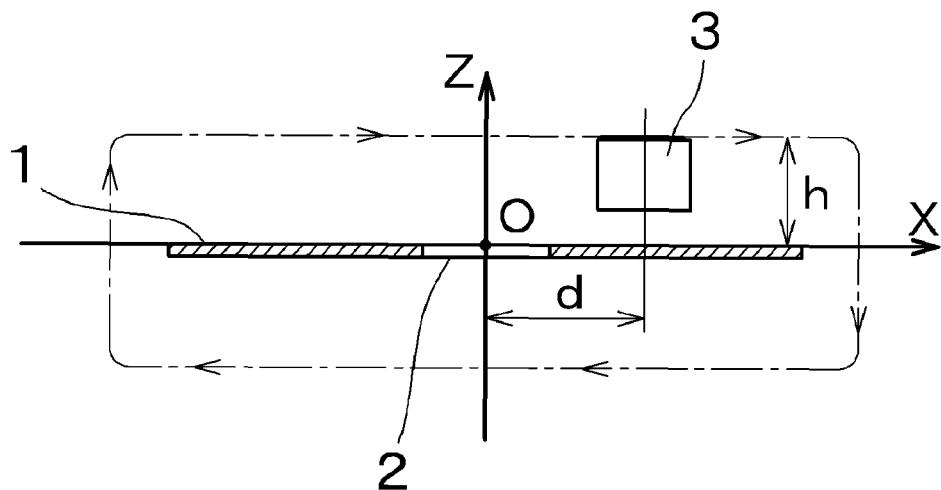
FIG. 3 is a sectional view showing the relationship between the primary conductor and a magnetic detection element.

As shown in FIG. 3, a height h of the detection portion 4 of the magnetic detection element 3 from the primary conductor 1 is determined concerning the dielectric breakdown voltage based on a space, clearance, creepage distance, and the like structurally necessary for holding the positional relationship between the primary conductor 1 and the magnetic detection element 3.

Figure 4:
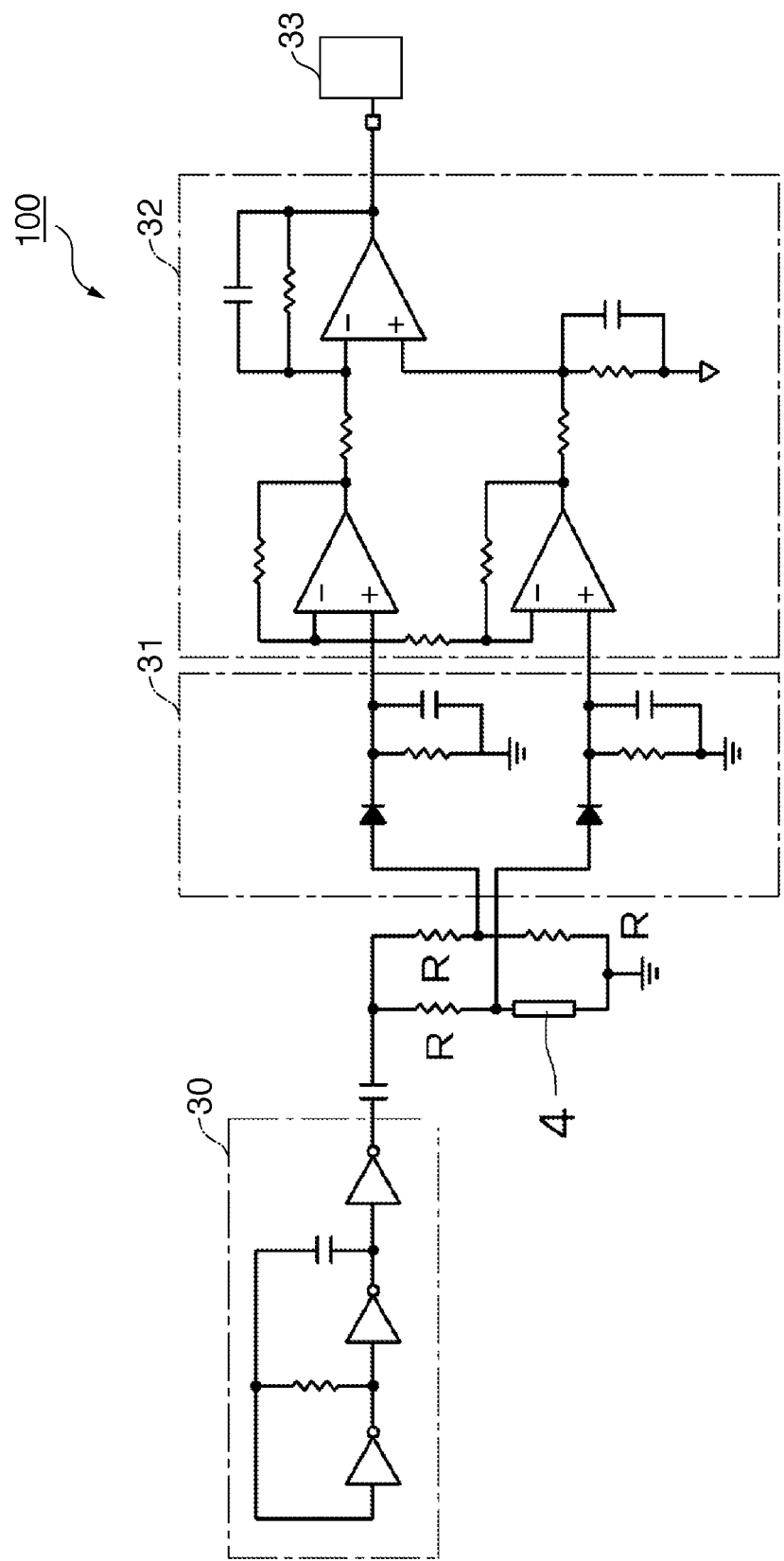
FIG. 4 is a circuit diagram showing the arrangement of a detection circuit.

FIG. 4 is a circuit diagram showing the arrangement of a detection circuit 100 functioning as a current measurement device. The detection portion 4 of the magnetic detection element 3 is connected to a resistor R that constitutes a bridge to a CR pulse oscillation circuit 30. A detection circuit 31 extracts an amplitude change from a voltage across the detection portion, which is the detection signal of the detection portion 4, and outputs it to an amplification circuit 32. The amplification circuit 32 amplifies the amplitude change and outputs it. An estimation circuit 33 estimates the amount of the measurement target current from the output of the amplification circuit 32.

FIGS. 5 and 6 show the results of simulations of the Y-axis magnetic field component Hy concerning the bypass current Ia by the through hole 2. The primary conductor 1 is a copper plate having a section with the X-axis width w=10 mm and a Z-axis thickness t=70 μm and a sufficient length in the Y-axis direction that is calculated as infinite. The through hole 2 is formed at the center in the X-axis direction. The detection portion 4 is fixed at the height h of 1.6 mm from the primary conductor 1. A change in the Y-axis magnetic field vector component Hy when the measurement target current I of 1 ampere (A) was supplied in the Y-axis direction was checked.

FIG. 5 shows, as a distribution of contours, the calculation result of the Y-axis magnetic field vector component Hy when the through hole has a diameter of 2 mm. FIG. 6 shows, as a distribution of contours, the calculation result of the Y-axis magnetic field vector component Hy when the through hole has a diameter of 3 mm. In the first quadrant where the coordinates X≥0 and Y≥0, the apex of the vector component Hy is set to 100%, and the contours are plotted in 10% increments. In each of the remaining quadrants, a magnetic field distribution symmetric about the X- or Y-axis is formed. In the third quadrant, a magnetic field having the same polarity as in the first quadrant is formed. In each of the second and fourth quadrants, a magnetic field having a polarity opposite to that in the first quadrant is formed.

The peak position where the magnetic field is maximized is at about 45° from the through hole 2, as can be seen from FIGS. 5 and 6. When the diameter of the through hole 2 is 2 mm, the peak position is almost at (X, Y)=(1.5 mm, 1.625 mm). When the diameter of the through hole 2 is 3 mm, the peak position is almost at (X, Y)=(1.75 mm, 1.75 mm). The magnetic field components Hy at the peak positions of these magnetic fields are Hy=25.6 mgauss (G) and Hy=47.9 mgauss (G) for a current of 1 ampere (A).

Figure 7:
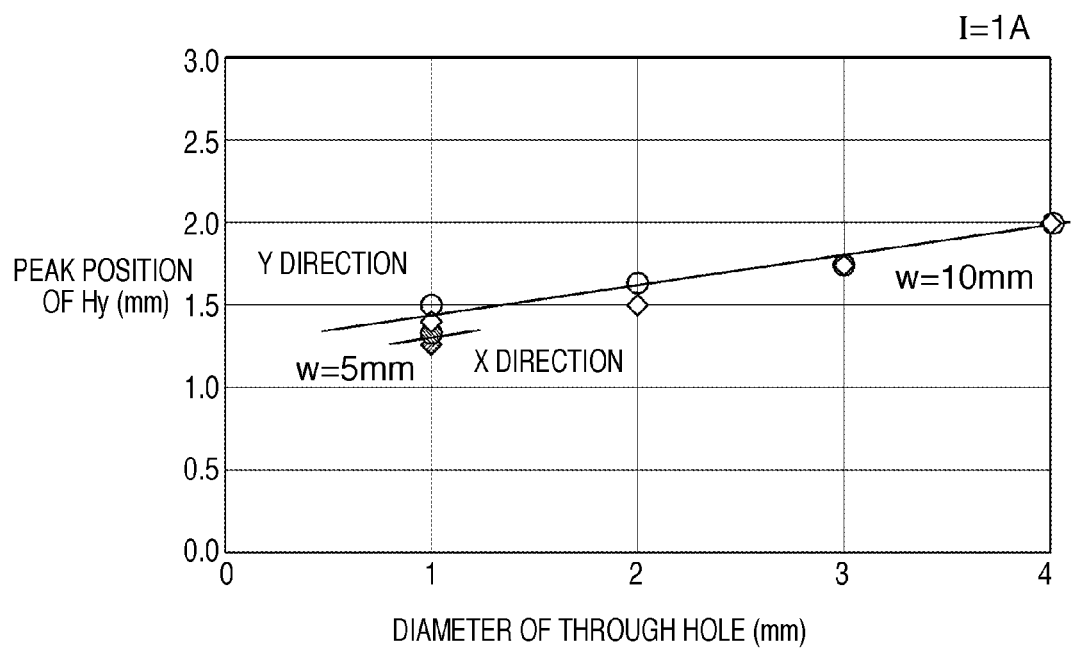
FIG. 7 is a graph showing the relationship between the diameter of the through hole and the peak position of the Y-axis magnetic field component.

FIG. 7 is a graph showing the relationship between the diameter of the through hole 2 and the peak position of the Y-axis magnetic field vector component Hy. FIG. 7 also shows the results for diameters of 1 mm and 4 mm, although they are not illustrated in the contour maps of FIGS. 5 and 6. As is apparent from FIG. 7, the diameter of the through hole 2 rarely depends on the position of the peak portion. Considering the result for the through hole 2 having a diameter of 1 mm at the width w=5 mm as well, the range of the peak of the vector component Hy is supposed to be about 1 to 2 mm in both the X- and Y-axis directions within the practical use range of the primary conductor 1.

The range of 90% lower than the peak by 10% forms a circle having a radius of about 0.5 mm. Hence, both the distances dx and dy in FIG. 1 range from 0.5 mm to 2.5 mm in terms of design, and the detection portion 4 of the magnetic detection element 3 is located in this range.

Figure 8:
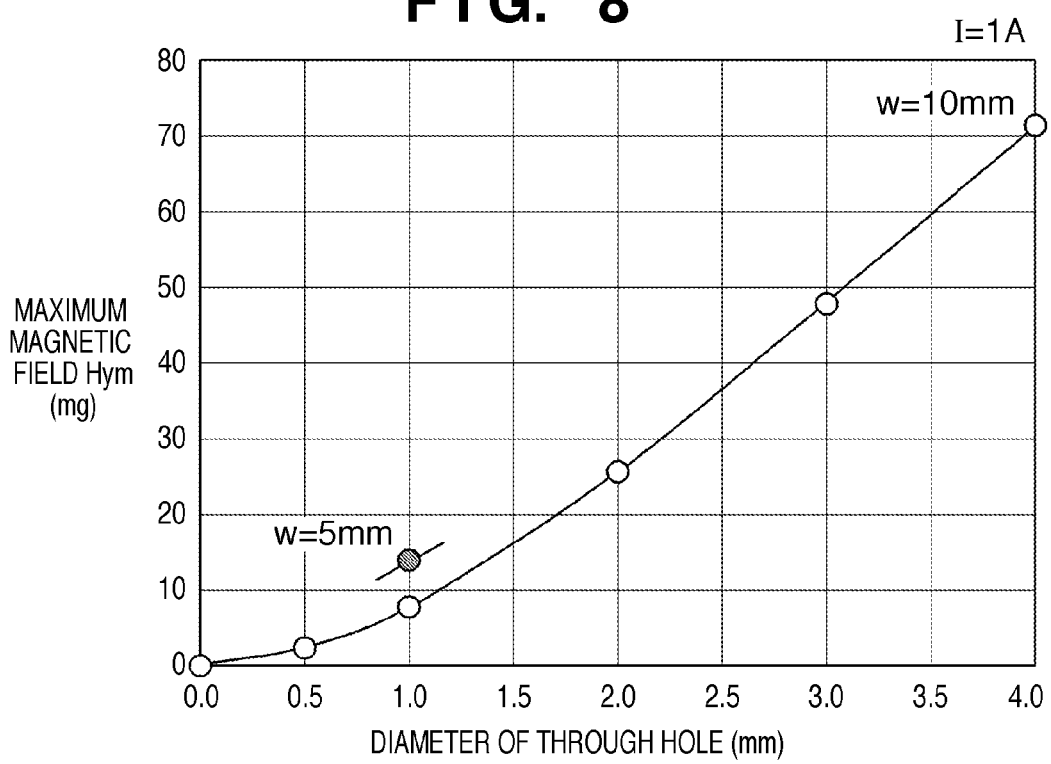
FIG. 8 is a graph showing the relationship between the diameter of the through hole and the peak value of the Y-axis magnetic field component.

FIG. 8 is a graph showing the relationship between the diameter of the through hole 2 of the primary conductor 1 and the peak value of the Y-axis vector component Hy. As is apparent from FIG. 8, the larger the diameter is, the larger the vector component Hy expressed as a quadratic function is. That is, a measurement range several-fold larger can be selected only by fixing the detection portion 4 of the magnetic detection element 3 almost at the distance dx=1.5 mm and dy=1.5 mm shown in FIG. 1 and changing the diameter of the through hole 2.

Referring to FIG. 1, the magnetic detection element 3 is provided in the first quadrant on the X-Y plane. However, it may be arranged in another quadrant because of the symmetry, as a matter of course.

FIG. 9 illustrates a modification. A through hole 2' is provided at 45° in the X-axis direction from the origin O where the through hole 2 exists. The magnetic detection element 3 is arranged at the intermediate position between the through holes. With this arrangement, the effect of the bypass current Ia by the two through holes 2 and 2' is enhanced to increase the magnetic field of the Y-axis component and raise the sensitivity. The two through holes 2 and 2' need not have the same size. The number of through holes 2 may be increased. The angular position to form the through hole is designed in accordance with the current detection specifications.

Using not only the through hole 2 but also a notch hole to form a nonconductive area as the means for making the current bypass allows to cope with both large and small currents. For example, the bypass current can be formed by providing a notch hole 8 at an end of the primary conductor 1 in the widthwise direction, as shown in FIG. 10. This arrangement is suitable for suppressing the magnetic field by the bypass current using a large current.

Reversely, it is also possible to cope with a small current by making the notch hole 8 deeper to concentrate the bypass current and increase the magnetic field of the Y-axis component, as shown in FIG. 11. Alternatively, as shown in FIG. 12, another notch hole 8 is formed from the opposite end at a shifted position to further increase the bypass current. This makes it possible to cope with a smaller current.

<Second Embodiment>

Figure 13:
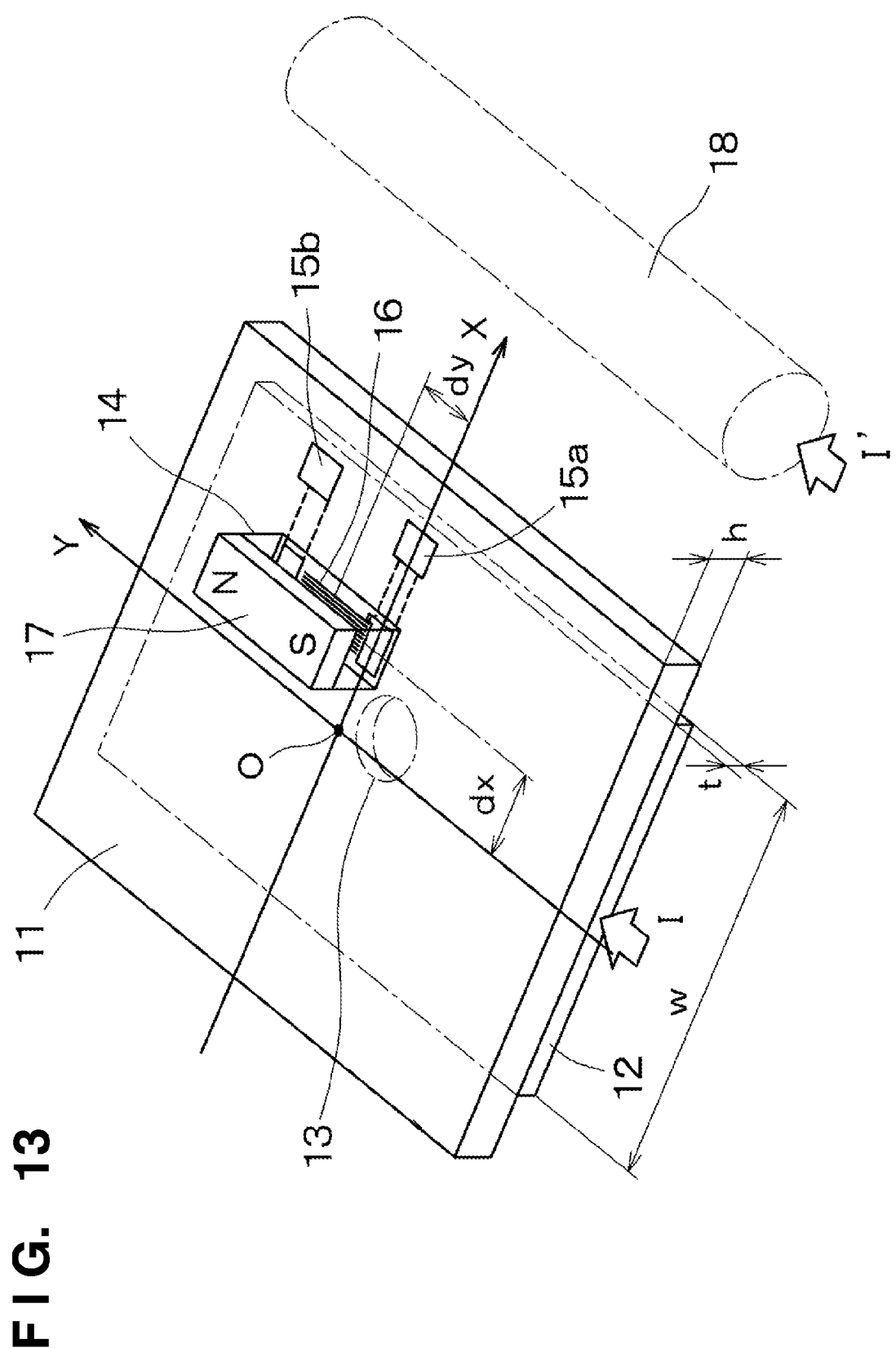
FIG. 13 is a perspective view showing the arrangement of the second embodiment.

FIG. 13 is a perspective view showing the arrangement of the second embodiment. For example, a primary conductor 12 formed from a copper pattern having an X-axis width of 10 mm, a Z-axis thickness of 70 μm, and a length of 50 mm in the longitudinal direction, that is, the Y-axis direction is provided on one surface of a sensor board 11 made of a glass epoxy material and having a thickness of 1.6 mm. A through hole 13 having a diameter of, for example, 2 mm is formed at the center of the primary conductor 12 in the X-axis direction by etching. An integrated magnetic detection unit 14 is arranged at the same position as in FIG. 1 on the other surface of the sensor board 11. Electrodes 15a and 15b for soldering are extracted onto the sensor board 11.

A magnetic impedance element is used as the magnetic detection unit 14. In a detection portion 16 formed from an Fe—Ta—C-based thin magnetic film, 11 elongated patterns each having, for example, a width of 18 μm, a thickness of 2.65 μm, and a length of 1.2 mm are juxtaposed. The detection portion 16 has the magnetic field detection direction only in the Y-axis direction.

The position of the detection portion 16 is offset from the center of the through hole 13 by a distance dx=1.5 mm in the X-axis direction and a distance dy=1.5 mm in the Y-axis direction. Although not illustrated, the plurality of thin magnetic film patterns of the detection portion 16 are electrically connected in series to form a meandering pattern whose ends are connected to corresponding electrodes, soldered to the electrodes 15a and 15b on the sensor board 11, and connected to a sensor circuit (not shown). Referring to FIG. 13, a high-frequency pulse is applied in the direction from the electrode 15a to the electrode 15b.

The thin magnetic films of the magnetic detection unit 14 have an axis of easy magnetization in the widthwise direction that is the X-axis direction. When a high-frequency pulse is applied to the thin magnetic film patterns, the impedance is changed by an external magnetic field. The voltage across the magnetic detection unit 14 is converted into a sensor signal by amplitude detection.

To evaluate the influence of a current other than a measurement target current I that flows in parallel, a copper rod 18 having a diameter of 2 mm was parallelly arranged at an interval of 10 mm from the primary conductor 12, as shown in FIG. 13. The measurement was performed while supplying a 50-Hz current I' of 10 Arms but supplying no current to the primary conductor 12. In this case, the level of the current I' flowing to the copper rod 18 was equal to or lower than the noise level (equal to or lower than 10 mVpp) so no influence of the current I' was observed by the magnetic detection unit 14.

A magnetic field from the adjacent parallel current line has only an X- or Z-axis component and no Y-axis component, and the magnetic impedance element has no sensitivity in the X-axis direction. It was confirmed that these facts effectively acted, and the influence of the magnetic field by the adjacent current was not problematic.

Figure 14:
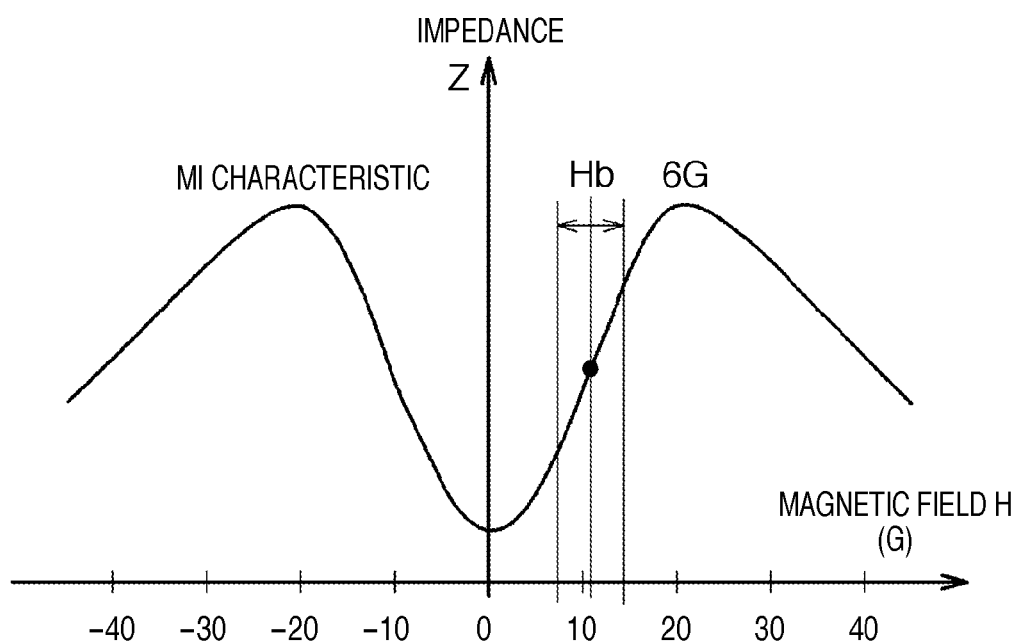
FIG. 14 is a graph showing the characteristic of a magnetic impedance element.

In 5-Mz pulse driving at 5 V, the magnetic detection unit 14 exhibits a V-shaped impedance change characteristic for a magnetic field, as shown in FIG. 14, and uses a portion with a gradient of high sensitivity. To do this, a bias magnet 17 is arranged on the back surface of the magnetic detection unit 14, as shown in FIG. 13, to apply a bias magnetic field of about 10 gauss (G) to the detection portion 16. In the magnetic detection unit 14, a linear satisfactory range is about ±3 gauss (G) on both sides of the bias operating point.

Figure 15:
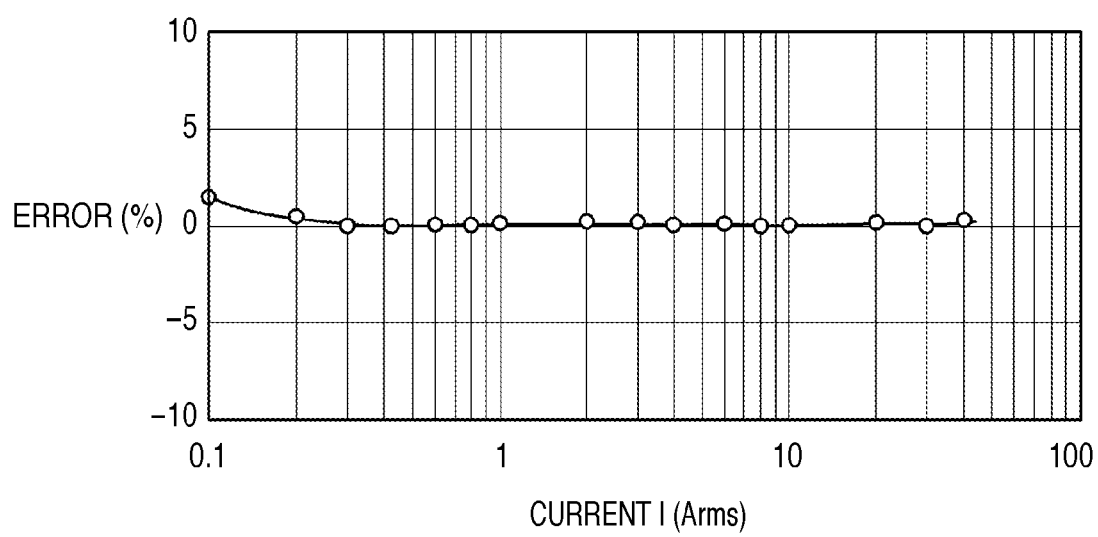
FIG. 15 is a graph of a detected current and a measurement error.

FIG. 15 shows the data of current measurement obtained by supplying an AC current (50 Hz) to the primary conductor 12 variably within the range of 0.1 to 40 Arms. A current of 10 Arms is a sine wave of 28.28 App. The magnetic field at this time is 724 mGpp based on the simulation result. FIG. 15 shows the error between the ideal value and the actual measured value based on 10 Arms. Since adjusted to 1 Vpp for 10 Arms of a 5-V power supply, the upper limit is 40 Arms. As the accuracy, an error of ±1% or less is guaranteed for 0.2 Arms or more.

When the through hole 13 has a diameter of 2 mm, and the linearity range of the magnetic detection unit 14 is 6 gauss (G), the current exceeds the ideal value at a portion little more than 80 Arms. To cope with a current up to 200 Arms, the diameter of the through hole 13 is decreased to 1 mm to reduce the magnetic field applied to the magnetic detection unit 14 to ⅓. This allows to cope with a current as large as 270 Arms using the same layout. To the contrary, making the through hole 13 larger allows to cope with specifications for a small current.

Figure 16:
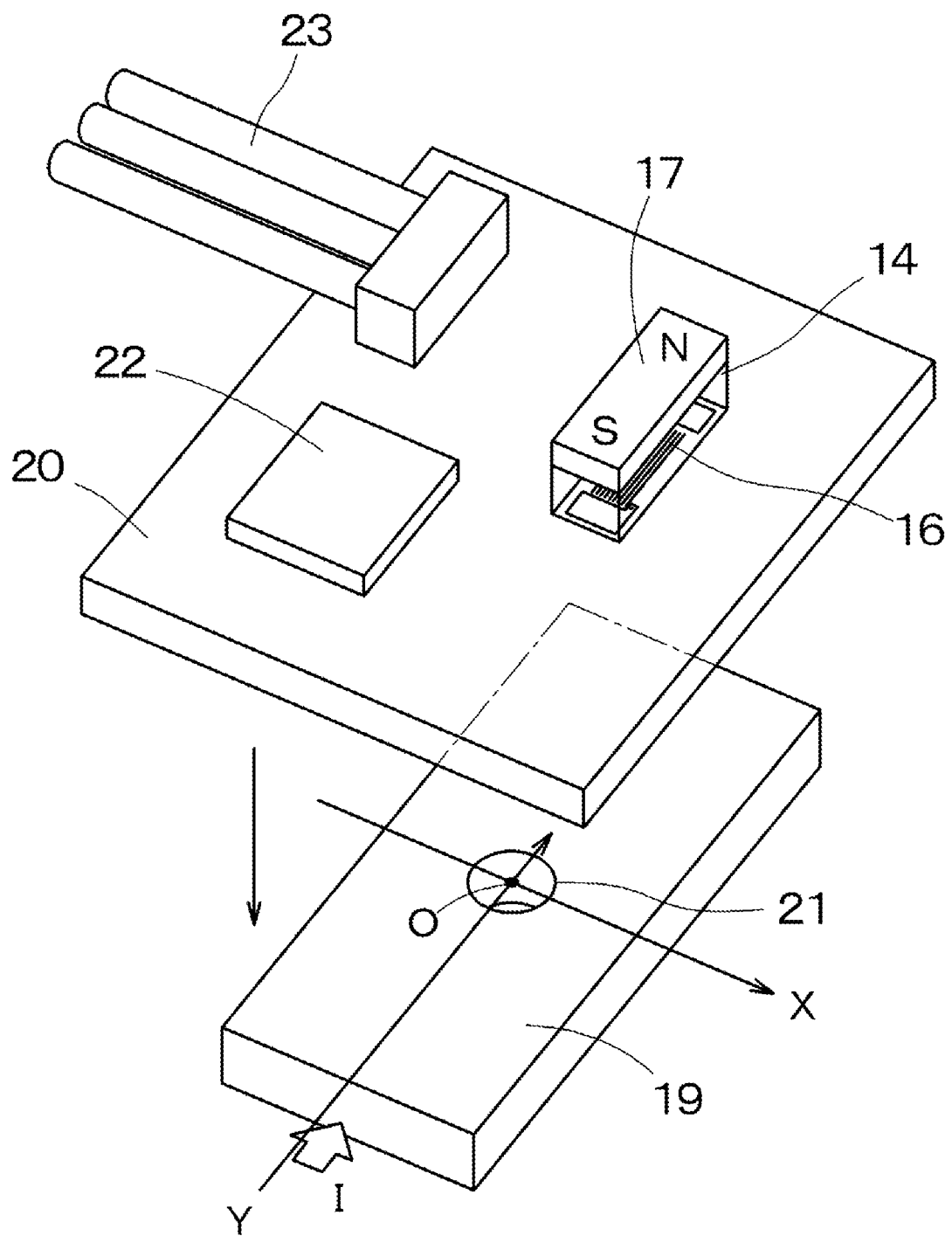
FIG. 16 is a perspective view showing the arrangement of a modification.

The second embodiment assumes an example in which the primary conductor 12 is arranged on the sensor board 11. However, when the primary conductor is a bus bar 19 formed from a copper plate, as indicated by a modification shown in FIG. 16, a structure obtained by removing the primary conductor 12 from the form shown in FIG. 13 can be placed as a module on a sensor board 20. In this case, the sensor board 20 that is aligned with a through hole 21 formed in the bus bar 19 and fixed to the bus bar 19 by bonding or the like can be used. Note that reference numeral 22 denotes a circuit element provided on the sensor board 20; and 23, a signal line that extracts the signal of the magnetic detection unit 14.

Even after the bus bar 19 is laid in advance, the above-described arrangement enables easy assembly by forming the magnetic detection unit 14 as a module and assembling it to the bus bar 19.

Note that in the above-described embodiments, a nonconductive area is provided using a through hole or a notch hole to make the current bypass. However, the current can also be made to bypass by arranging not a hole portion but an insulating material.

<Third Embodiment>

Japanese Patent Laid-Open No. 2006-184269 proposes avoiding an disturbance magnetic field by difference detection using two magnetic detection elements. In this patent literature, to avoid the influence of an external magnetic field when detecting a magnetic field by a measurement target current using a single magnetic sensor, an opening portion is formed at the center of a bus bar serving as a primary conductor to branch the measurement target current. Magnetic detection elements are arranged such that magnetic fields having phases opposite to each other are generated by the current near the two conductors in the opening portion, and only a magnetic field generated from the bus bar is detected by differential amplification.

In this method, the influence on a uniform magnetic field can be eliminated. However, if current lines are adjacently arranged in parallel, the two magnetic detection elements are not equally applied with a magnetic field as the disturbance. As a result, a magnetic shield is eventually indispensable. To solve this problem, the first and second embodiments have proposed providing the primary conductor with a nonconductive area and providing one magnetic detection element near the nonconductive area. A plurality of magnetic detection elements may be provided. In the third embodiment, a proposal to provide a plurality of magnetic detection elements will be described.

Figure 17:
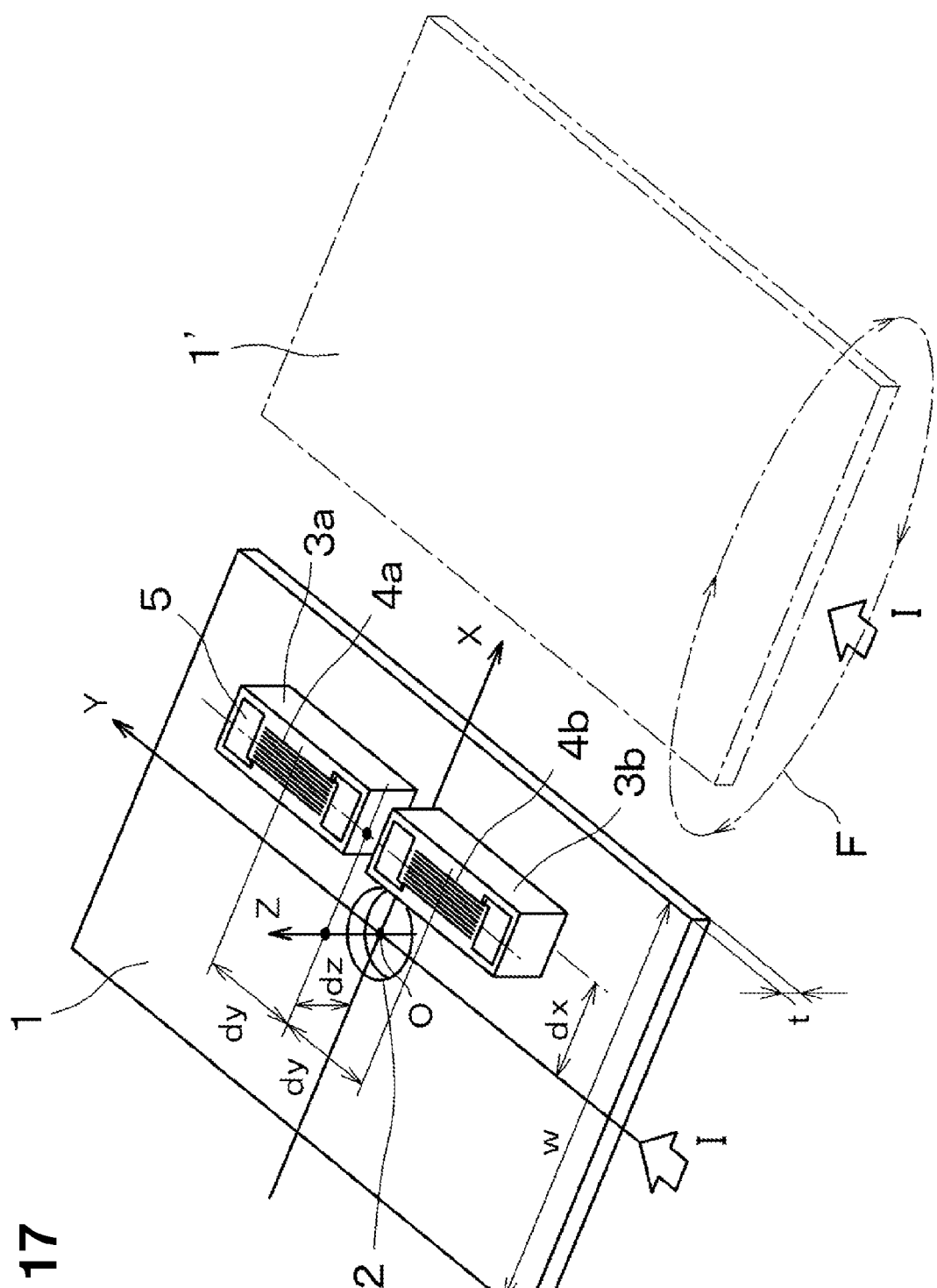
FIG. 17 is a perspective view showing the basic arrangement of a current sensor according to the third embodiment.

FIG. 17 is a perspective view showing the arrangement of a basic current sensor according to the third embodiment in which a measurement target current is measured. A measurement target current I to be detected flows to a primary conductor 1. The primary conductor 1 has a form of, for example, a copper foil pattern on a printed board or a bus bar formed from a copper plate.

Figure 18:
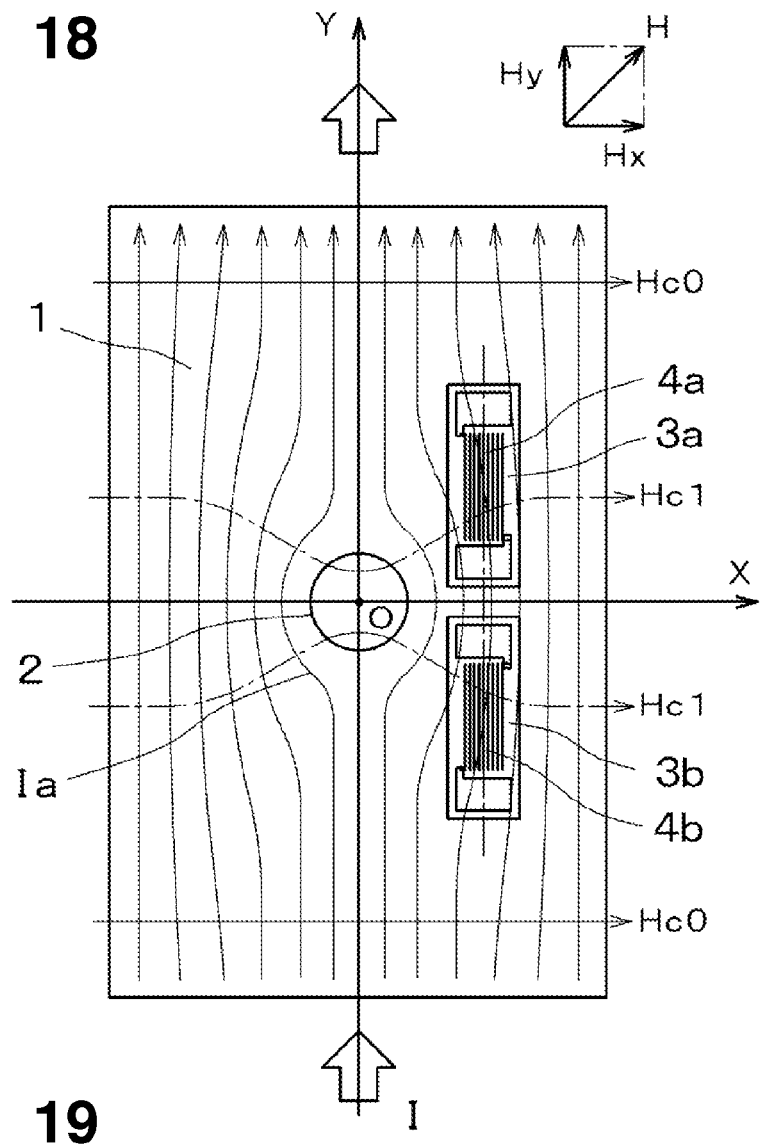
FIG. 18 is an explanatory view of the state of a current and a magnetic field in a primary conductor.

A circular through hole 2 that is a nonconductive area is provided at almost the center of the primary conductor 1 to partially cut off the current. Hence, the measurement target current I partially becomes a bypass current Ia that symmetrically flows around outside on both sides of the through hole 2, as shown in FIG. 18. For the descriptive convenience, coordinate axes are set for the primary conductor 1. Setting an origin O at the center of the through hole 2, the main direction in which the measurement target current I flows is defined as the Y-axis, the widthwise direction perpendicular to the main direction is defined as the X-axis, and the direction of thickness is defined as the Z-axis.

Two magnetic detection elements 3a and 3b are arranged on the primary conductor 1 in series in the Y-axis direction to perform differential detection. The magnetic field detection direction of detection portions 4a and 4b of the magnetic detection elements 3a and 3b is set in the Y-axis direction. The center of each of the detection portions 4a and 4b is arranged at a position shifted from the center of the through hole 2 by a distance dx in the X-axis direction and dy in the Y-axis direction while sandwiching the X-axis.

Even when a primary conductor 1' to which a current in a different phase flows is in the neighborhood, and the direction of a neighboring current I' is parallel to that of the measurement target current I, as shown in FIG. 17, the magnetic field generated by a magnetic flux F of the neighboring current I' has only a vector component in the X-axis direction and no component in the Y-axis direction. When the magnetic field detection direction of the detection portions 4a and 4b is set in the Y-axis direction, the magnetic detection elements 3a and 3b can detect only a vector component Hy of the measurement target current I without any interference with the magnetic field by the neighboring current I'. It is therefore possible to obtain the amount of the measurement target current I by calibrating and converting the vector component Hy.

Since it is not preferable to detect a magnetic field vector component Hx in the X-axis direction, a magnetic impedance element or orthogonal fluxgate element having high directivity is suitable as the magnetic detection elements 3a and 3b. In the third embodiment, a magnetic impedance element is used. In each of the detection portions 4a and 4b, thin magnetic film patterns are juxtaposed to form a meandering pattern in the Y-axis direction that is the magnetic field detection direction. A high-frequency pulse in the MHz band is applied to electrodes 5 at the two ends. A change in the voltage amplitude from the two terminals of each of the detection portions 4a and 4b caused by a change in the magnetic field is obtained as a sensor signal.

Figure 19:
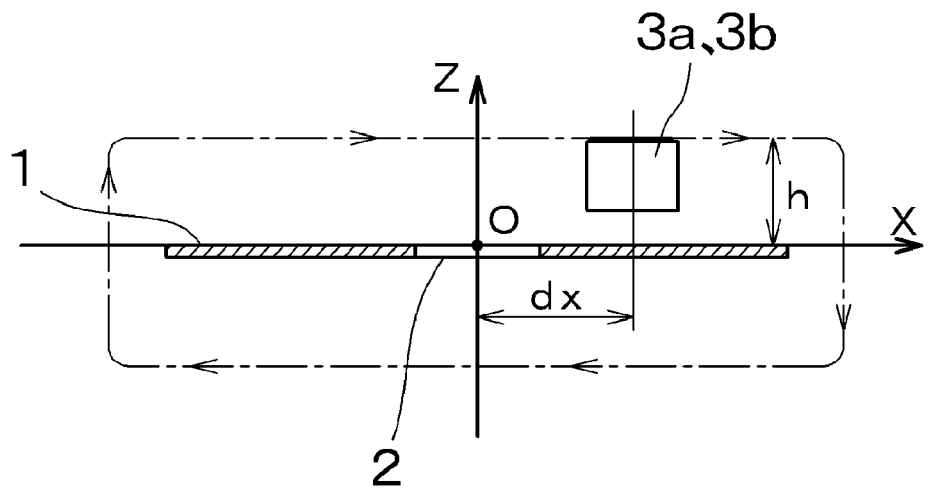
FIG. 19 is a sectional view showing the relationship between the primary conductor and a magnetic detection element.

As shown in FIG. 19, a height h of the detection portions 4a and 4b of the magnetic detection elements 3a and 3b from the primary conductor 1 is determined concerning the dielectric breakdown voltage based on a space, clearance, creepage distance, and the like structurally necessary for holding the positional relationship between the primary conductor 1 and the magnetic detection elements 3a and 3b.

Figure 20:
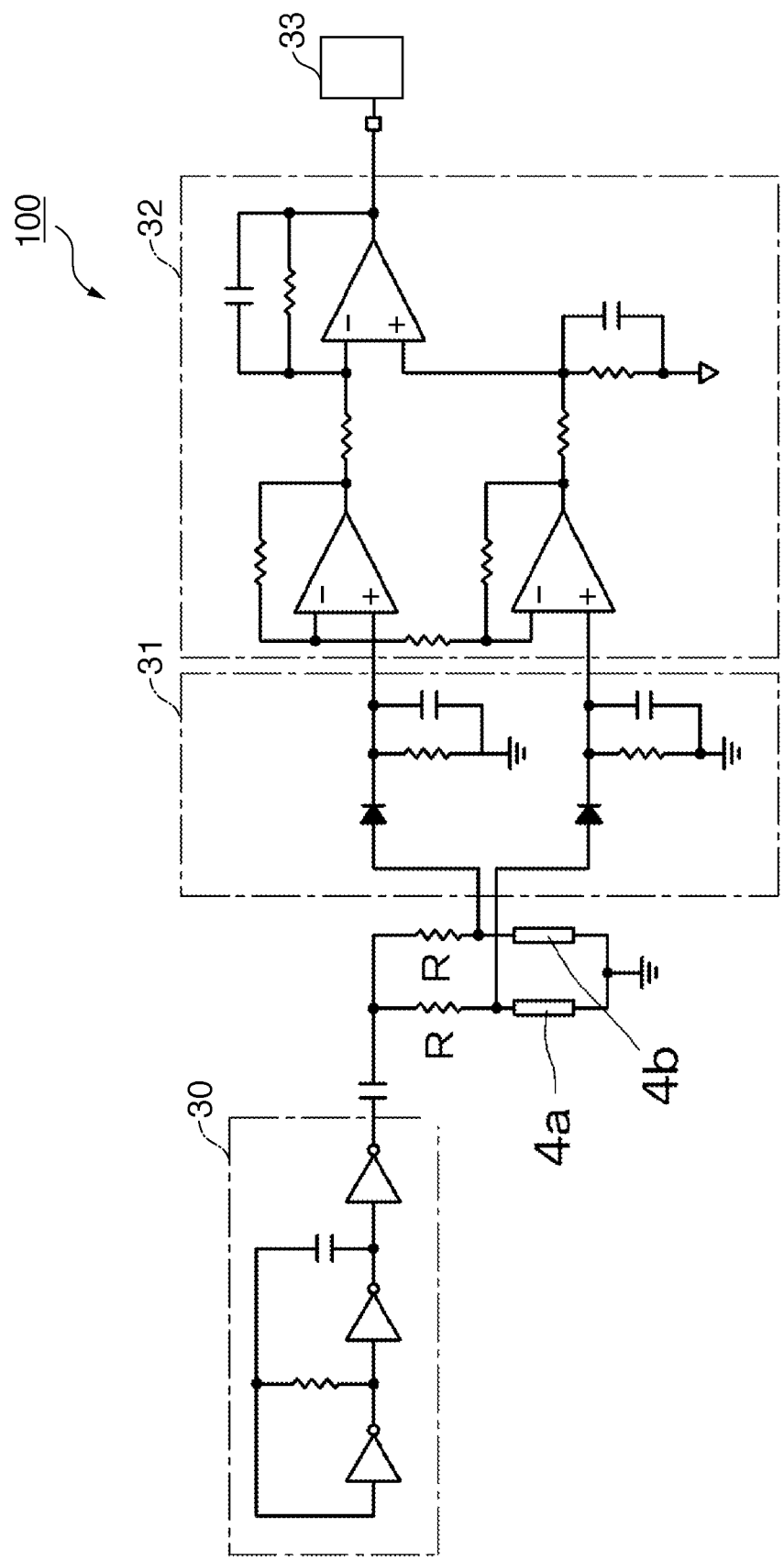
FIG. 20 is a circuit diagram showing the arrangement of a detection circuit.

FIG. 20 is a circuit diagram of a detection circuit. The detection portions 4a and 4b of the magnetic detection elements 3a and 3b are connected to resistors R that constitute a bridge to a CR pulse oscillation circuit 30. After a detection circuit 31 extracts amplitude changes from the voltages across the detection portions 4a and 4b, an amplification circuit 32 performs differential amplification of the outputs from the detection portions 4a and 4b, thereby obtaining the output of the current sensor.

In this case, the outputs of the detection portions 4a and 4b have the same absolute value and different polarities if they have the same sensitivity and are located to be symmetric about the X-axis. For this reason, when the signals are detected differentially, a value twice the absolute value of the output from the detection portion 4a or 4b is obtained as the output. In addition, external magnetic field noises are in phase for the detection portions 4a and 4b within a narrow range. When the outputs of the detection portions 4a and 4b are differentially detected, the magnetic field noises cancel each other and are not superimposed on the output of the current sensor. Hence, only the vector component Hy of the bypass current is measured. Note that to differentially detect the outputs of the magnetic detection elements, at least two detection portions are used. Note that as is apparent from comparison between FIGS. 20 and 4, the four resistors that form the bridge circuit are replaced with the detection portions. For example, three resistors out of the four resistors are replaced with the detection portions when employing three detection portions. When employing four detection portions, all resistors are replaced with the detection portions.

Referring to FIG. 17, the magnetic detection elements 3a and 3b are provided in the first and fourth quadrants on the X-Y plane, respectively. However, they may be arranged adjacently in other quadrants because of the symmetry, as a matter of course.

Figure 21:
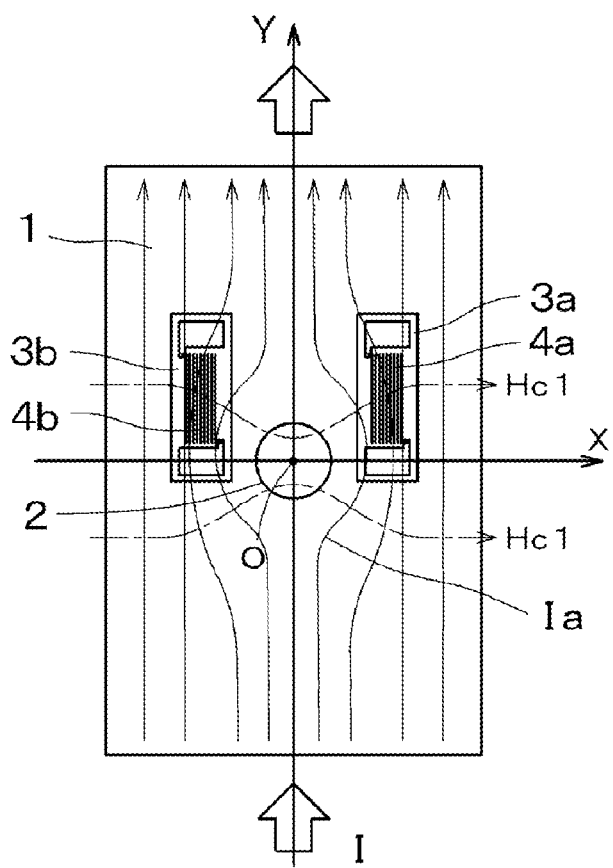
FIG. 21 is a view showing the arrangement of a modification.

FIG. 21 shows a modification in this case. The same result can be obtained even when the magnetic detection element 3a is provided in the first quadrant, and the magnetic detection element 3b is arranged in the second quadrant so that they are arranged symmetrically about the Y-axis. Magnetic field vector components Hc1 by the bypass current Ia are symmetric about the Y-axis in the first and second quadrants. Hence, when the magnetic detection elements 3a and 3b are arranged in the first and second quadrants, respectively, the Y-axis vector components Hy having the same absolute value and opposite polarities can be detected. In this case, although slightly affected by the adjacent parallel current lines, magnetic field noises can almost be canceled by differential detection because the interval between the magnetic detection elements 3a and 3b is narrow.

<Fourth Embodiment>

If the detection magnetic field range needs to be managed within a certain range from the viewpoint of magnetic saturation or linearity, like a magnetic impedance element or orthogonal fluxgate element that is a magnetic detection element, the measurement range is preferably adjustable only by the diameter of the through hole 2 of the primary conductor 1.

Figure 22:
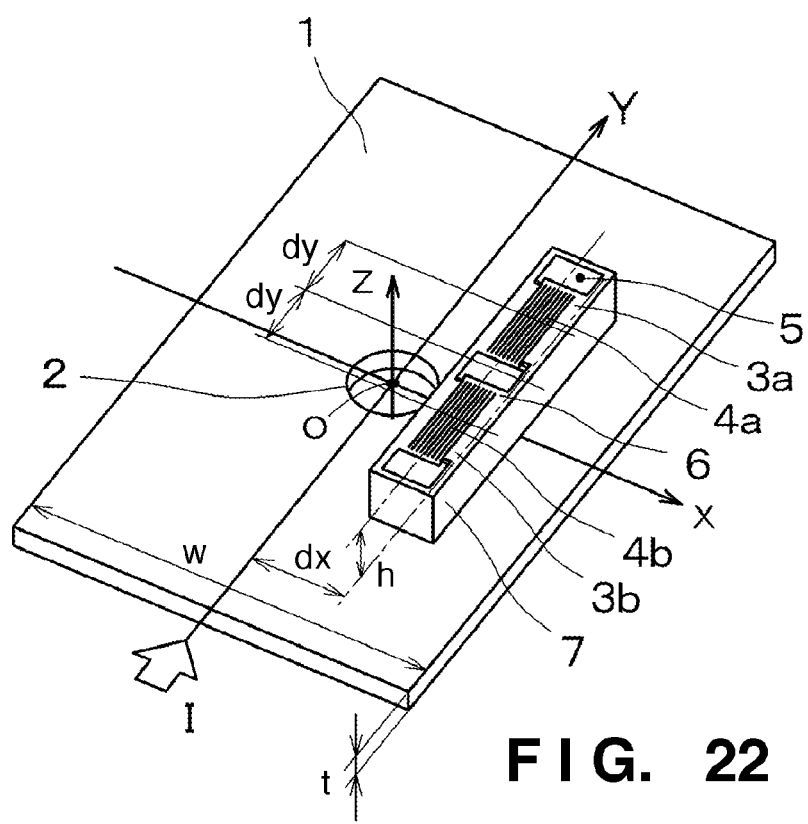
FIG. 22 is a perspective view showing the arrangement of the fourth embodiment.

FIG. 22 is a perspective view showing the arrangement of a current sensor according to the fourth embodiment. The distance between the detection portions 4a and 4b of the magnetic detection elements 3a and 3b in FIG. 17 is short. Hence, magnetic detection elements 3a and 3b arranged to be symmetric about the X-axis are integrally attached to a single element substrate 6 to form a magnetic detection unit 7. This allows to suppress a variation in performance.

Based on an idea to use only the positive area of the X-axis of a primary conductor 1, the bypass current can also be used by providing a notch hole 8 at an end in the widthwise direction, as shown in FIG. 23. Even the notch hole 8 makes it possible to do measurement like the case in which a through hole 2 is provided, as shown in FIG. 17. Note that to supply the bypass current symmetrically about the X-axis, the notch hole 8 needs to be symmetric about the X-axis.

FIG. 24 is a view showing the arrangement of another modification. In the magnetic detection unit 7 in which four magnetic detection elements 3a to 3d are integrated, detection portions 4a, 4b, 4c, and 4d are arranged in the first, second, third, and fourth quadrants, respectively. When the four elements are operated as a bridge arrangement, the S/N ratio can further be improved. When the detection portions 4a to 4d are arranged on both sides of the through hole 2 to be symmetric about the X- and Y-axes, vector components Hy are symmetric about the X- and Y-axes.

Hence, differential detection of the outputs of the detection portions 4a and 4d and differential detection of the outputs of the detection portions 4b and 4c concerning the X-axis and differential detection of the outputs of the detection portions 4a and 4b and differential detection of the outputs of the detection portions 4d and 4c concerning the Y-axis can simultaneously be performed. Averaging the detection results allows to further improve the measurement accuracy.

<Fifth Embodiment>

Figure 25:
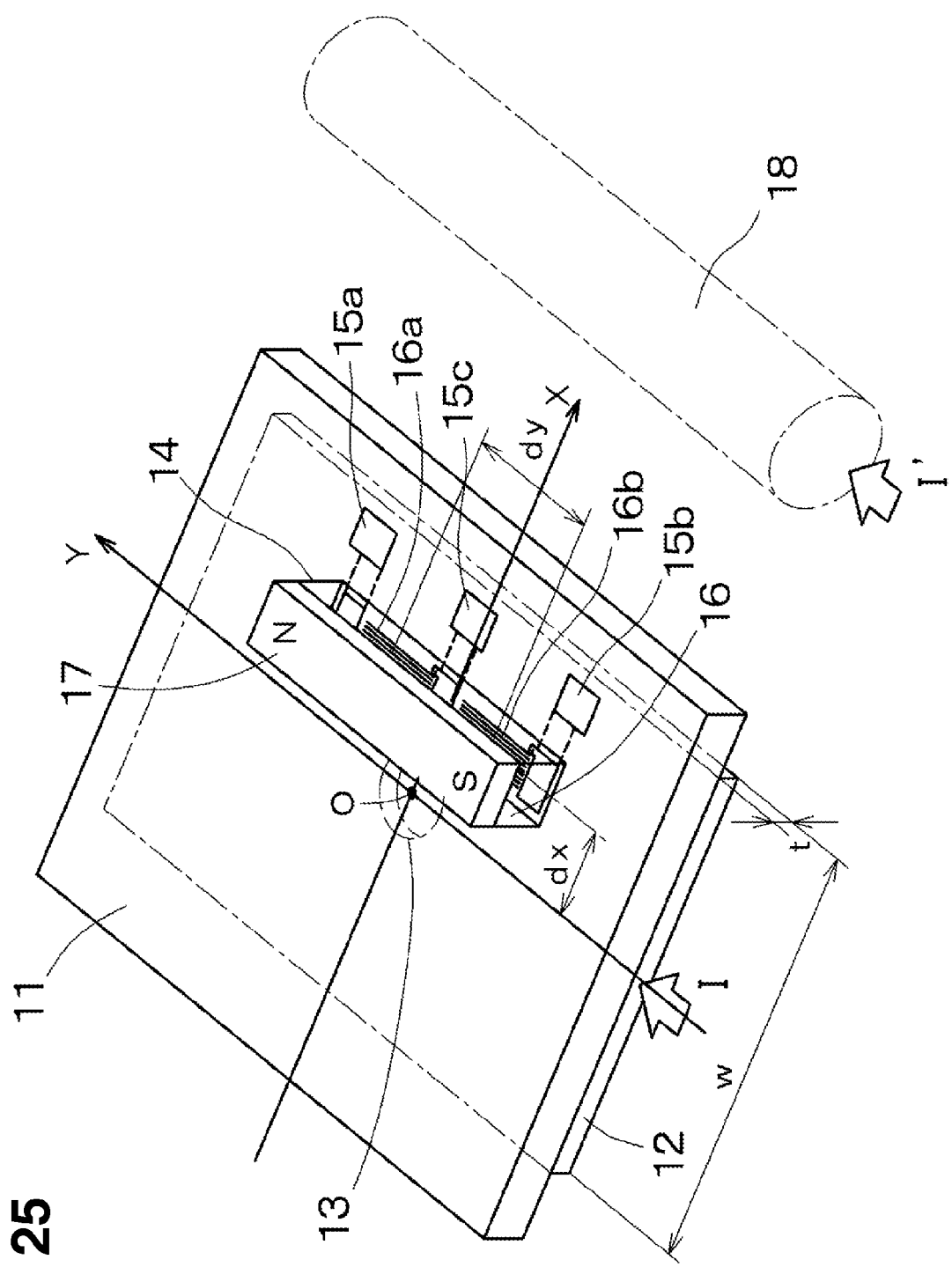
FIG. 25 is a perspective view showing the arrangement of the fifth embodiment.

FIG. 25 is a perspective view showing the arrangement of a current sensor according to the fifth embodiment. A primary conductor 12 formed from a copper pattern having an X-axis width of 10 mm, a Z-axis thickness of 70 μm, and a length of 50 mm in the longitudinal direction, that is, the Y-axis direction is provided on one surface of a sensor board 11 made of a glass epoxy material and having a thickness of 1.6 mm. A through hole 13 having a diameter of 2 mm is formed at the center of the primary conductor 12 in the X-axis direction by etching. An integrated magnetic detection unit 14 is arranged at the same position as in FIG. 22 on the other surface of the sensor board 11. Electrodes 15a to 15c for soldering are extracted onto the sensor board 11.

A magnetic impedance element is used as the magnetic detection unit 14. In each of detection portions 16a and 16b formed from an Fe—Ta—C-based thin magnetic film, 11 elongated patterns each having a width of 18 μm, a thickness of 2.65 μm, and a length of 1.2 mm are juxtaposed. The detection portions 16a and 16b have the magnetic field detection direction in the Y-axis direction.

The position of each of the detection portions 16a and 16b is offset from the center of the through hole 13 by a distance dx=1.5 mm in the X-axis direction. The center interval between the detection portions 16a and 16b is dy=3 mm. The detection portions 16a and 16b are arranged to be symmetric about the X-axis extending in the widthwise direction from a center O of the through hole 13.

Although not illustrated, the plurality of thin magnetic film patterns of each of the detection portions 16a and 16b are electrically connected in series to form a meandering pattern whose ends are connected to corresponding electrodes, soldered to the electrodes 15a to 15c on the sensor board 11, and connected to a sensor circuit (not shown). Referring to FIG. 25, a high-frequency pulse is applied in the directions from the electrode 15a to the electrode 15c and from the electrode 15b to the electrode 15c which are extracted to the sensor board 11.

The magnetic detection unit 14 has an axis of easy magnetization in the widthwise direction that is the X-axis direction. When a high-frequency pulse is applied to the thin magnetic film patterns, the impedance is changed by an external magnetic field. The voltage across the magnetic detection unit 14 is converted into a sensor signal by amplitude detection.

To evaluate the influence of a current other than a measurement target current I that flows in parallel, a copper rod 18 having a diameter of 2 mm was parallelly arranged at an interval of 10 mm from the primary conductor 12. The measurement was performed while supplying a 50-Hz current I' of 10 Arms but supplying no current to the primary conductor 12. In this case, the level of the current I' flowing to the copper rod 18 was equal to or lower than the noise level (equal to or lower than 10 mVpp) so no influence of the current I' was observed by the magnetic detection unit 14. A magnetic field from the adjacent parallel current line has only an X- or Z-axis component and no Y-axis component, and the distances between the adjacent copper rod 18 and the detection portions 16a and 16b are equal. For these reasons, it was confirmed that the differential removal function effectively acted, and the influence of the noisy magnetic field was almost completely removed.

The fifth embodiment assumes an example in which the primary conductor 12 is arranged on the sensor board 11. However, when the primary conductor is a bus bar 19 formed from a copper plate, as indicated by a modification shown in FIG. 26, a structure obtained by removing the primary conductor 12 from the form shown in FIG. 25 can be placed as a module on a sensor board 20. In this case, the sensor board 20 that is aligned with a through hole 21 formed in the bus bar 19 and fixed to the bus bar 19 by bonding or the like can be used. Note that reference numeral 22 denotes a circuit element provided on the sensor board 20; and 23, a signal line that extracts the signal of the magnetic detection unit 14.

Even after the bus bar 19 is laid in advance, the above-described arrangement enables easy assembly by forming the magnetic detection unit 14 as a module and assembling it to the bus bar 19.

Note that in the above-described embodiments, a nonconductive area is provided using a through hole or a notch hole to make the current bypass. However, the current can also be made to bypass by arranging not a hole portion but an insulating material. The nonconductive area needs to be symmetric about the X-axis.

<Sixth Embodiment>

In the first to fifth embodiments, a nonconductive area is employed as a direction change area. That is, each of the first to fifth embodiments is an invention for detecting a distorted magnetic field generated as a current bypasses the nonconductive area and estimating the current amount from the detected magnetic field. A concept common to the first to fifth embodiments is to provide the primary conductor with an area to prompt a nonlinear current flow. That is, the nonconductive area need not always be used if the current flowing direction can be bent. In the sixth embodiment, an another example of the direction change area will be explained.

Figure 27:
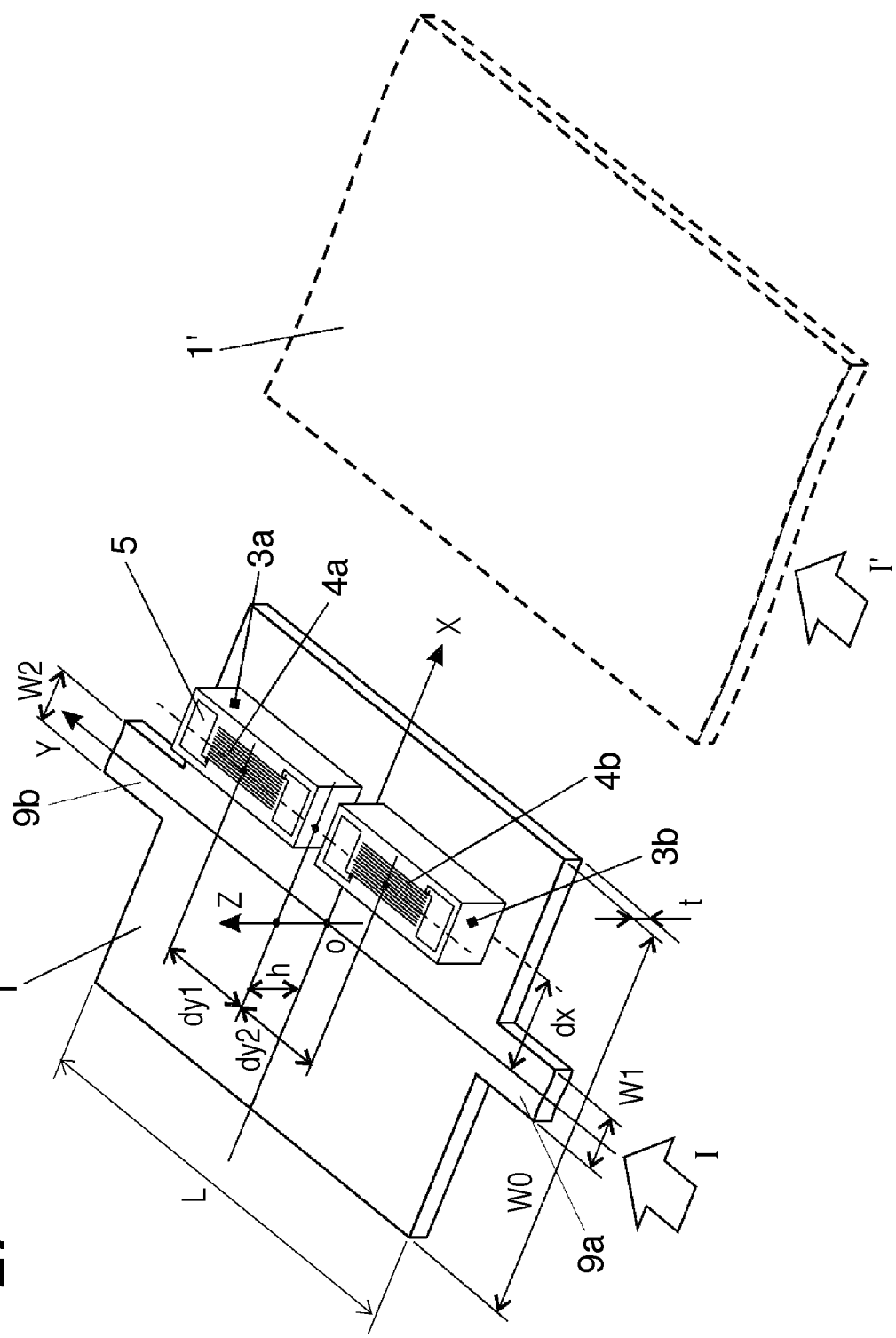
FIG. 27 is a perspective view showing the basic arrangement of a current sensor according to the sixth embodiment.

FIG. 27 is a perspective view showing the arrangement of a basic current sensor according to the sixth embodiment in which a measurement target current is measured. A measurement target current I to be detected flows to a primary conductor 1. The primary conductor 1 has a form of, for example, a copper foil pattern on a printed board or a bus bar formed from a copper plate.

Out of the primary conductor 1, a portion (main portion) serving as a magnetic field detection target is a rectangular portion having a length L and a width W0. In the main portion, an inlet 9a and an outlet 9b, which have widths W1 and W2, respectively, are formed on the front and rear sides in the current flowing direction, respectively. Both the widths W1 and W2 are smaller than the width W0. For the descriptive convenience, the inlet 9a and the outlet 9b are arranged at the center of the width W0.

Coordinate axes are set for the primary conductor 1. In this case, an origin O is set at the center of the magnetic detection unit. As shown in FIGS. 27 and 28, the origin O is set at the intersection between a line that connects the inlet 9a and the outlet 9b and divides the width W0 of the magnetic detection unit into two parts and a line that divides a length L of the magnetic detection unit into two parts. As in the other embodiments, the main direction in which the measurement target current I flows is defined as the Y-axis, the widthwise direction perpendicular to the main direction is defined as the X-axis, and the direction of thickness is defined as the Z-axis.

Two magnetic detection elements 3a and 3b are arranged on the primary conductor 1 in series in the Y-axis direction to perform differential detection. Note that one magnetic detection element may be used, as in the first and second embodiments. Each of the magnetic detection elements 3a and 3b has the same arrangement as in the first to fifth embodiments. The magnetic field detection direction of detection portions 4a and 4b of the magnetic detection elements 3a and 3b is set in the Y-axis direction, thereby arranging the magnetic detection elements 3a and 3b. The center of each of the detection portions 4a and 4b is arranged at a position shifted from the center of the origin O by a distance dx in the X-axis direction and dy1 and dy2 in the Y-axis direction while sandwiching the X-axis.

A magnetic flux generated by a current is originally directed in a direction perpendicular to the current direction. For this reason, a magnetic field HC1 having only a vector component Hx in the X-axis direction is formed at a portion where no current component directed in the widthwise direction of the primary conductor 1 exists, that is, on the X-axis passing through the origin O.

However, a current at a position shifted forward or backward in the current flowing direction from the origin O has a current component that flows toward the inlet 9a or the outlet 9b at an angle with respect to the Y-axis direction. A vector component Hy in the Y-axis direction is thus generated, and the magnetic field meanders like Hc2 or Hc3. The magnetic fields Hc2 and Hc3 are line-symmetric about the X-axis. The vector components Hy have opposite polarities on both sides of the X-axis.

Even when a primary conductor 1' to which a current in a different phase flows is in the neighborhood, and the direction of a neighboring current I' is parallel to that of the measurement target current I, as shown in FIG. 27, the magnetic field generated by the neighboring current I' has only a vector component in the X-axis direction and no component in the Y-axis direction. When the magnetic field detection direction of the detection portions 4a and 4b is set in the Y-axis direction, the magnetic detection elements 3a and 3b can detect only a vector component Hy of the measurement target current I without any interference with the magnetic field by the neighboring current I'. It is therefore possible to obtain the amount of the measurement target current I by calibrating and converting the vector component Hy.

When the magnetic detection elements 3a and 3b detect the magnetic field vector component Hx in the X-axis direction, the current estimation accuracy lowers. Hence, for example, a magnetic impedance element or orthogonal fluxgate element having high directivity is used as the magnetic detection elements 3a and 3b. In the sixth embodiment, a magnetic impedance element is used as the magnetic detection elements 3a and 3b. In each of the detection portions 4a and 4b, thin magnetic film patterns are juxtaposed to form a meandering pattern in the Y-axis direction that is the magnetic field detection direction. A high-frequency pulse in the MHz band is applied to electrodes 5 at the two ends. A change in the voltage amplitude from the two terminals of each of the detection portions 4a and 4b caused by a change in the magnetic field is obtained as a sensor signal. If a bias magnetic field is necessary, it is applied by a magnet located close to or wound on the magnetic detection elements 3a and 3b, although not illustrated.

As shown in FIG. 29, a height h of the detection portions 4a and 4b of the magnetic detection elements 3a and 3b from the primary conductor 1 is determined concerning, for example, the dielectric breakdown voltage based on a space, clearance, creepage distance, and the like structurally necessary for adjusting the magnitude of a magnetic field to be generated and holding the positional relationship between the primary conductor 1 and the magnetic detection elements 3a and 3b.

The circuit arrangement shown in FIG. 20 can be employed as the arrangement of a detection circuit 100 that functions as a current detection device. This is because even if the detailed arrangement of the area to change the current flowing direction, that is, the direction change area changes, the basic portion of the current detection device according to the present invention can directly be used.

FIGS. 30A to 30D and 31 show the results of simulations of the Y-axis magnetic field component Hy concerning the diffusion current from the narrow inlet and outlet. The primary conductor 1 has a section with the X-axis width W0=8 mm and a Z-axis thickness t=0.8 mm. The interval L between the inlet 9a and the outlet 9b is 7.5 mm. The inlet and outlet are located at the center of the width W0 in the widthwise direction. Setting the widths of the inlet 9a and the outlet 9b to W1=W2=d, the magnetic field Hy in the main direction in which the current flowed on the surface (height H=1.6 mm) of the primary conductor was calculated while changing d to 0.8, 1.2, 2.4, and 3.6 mm. The measurement target current I was set to 1 ampere (A). FIGS. 30A to 30D show the result of simulations when d=0.8, 1.2, 2.4, and 3.6 mm, respectively. In the first quadrant where the coordinates X≥0 and Y≥0, the apex of the vector component Hy is set to 100%, and the contours are plotted in 10% increments. In each of the remaining quadrants, a magnetic field distribution symmetric about the X- or Y-axis is formed. In the third quadrant, a magnetic field having the same polarity as in the first quadrant is formed. In each of the second and fourth quadrants, a magnetic field having a polarity opposite to that in the first quadrant is formed.

A peak position P is almost unchanged at 2.5 mm in the Y direction and moderately moves from 1.7 mm to 2.15 mm in the X direction as the width of the inlet/outlet increases.

Let L be the distance from the inlet/outlet. The peak position P is at L=7.5 mm and 1.25 (=L/2−2.5) mm. The peak position calculated for L=11.5 mm is 1.35 mm, and the difference is not so large. The practical distance L is determined considering that the peak can clearly be formed, and no interference with the adjacent peak in an opposite phase occurs. For example, the distance L should be equal to or more than 1.25 mm×4=5 mm.

FIG. 31 is a graph showing the magnetic field Hy at the peak position. As is apparent from FIG. 31, when the ratio of the width W1 of the inlet 9a and the outlet 9b to the width W0 is 10% (W0=8 mm, and d=0.8 mm), a magnetic field of 0.08 gauss per 1 A is generated. A magnetic detection element capable of detecting a magnetic field on the order of milligauss or less can detect even a small measurement target current of 1 A or less at a sufficient S/N ratio when it is placed at the peak position.

When the widths W1 and W2 of the inlet 9a and the outlet 9b increase, current components spreading in the widthwise direction decrease, and the magnetic field Hy abruptly lowers. Hence, to detect a large current, the widths W1 and W2 are increased. When the ratio of the width W1 to the width W0 is 100%, that is, d=8 mm, the magnetic field becomes zero. This means that the adjustment range for a large current can be widened. As is apparent from the above description, fixing the magnetic detection element at a position corresponding to X=2 mm and Y=2.5 mm makes it possible to cope with various current detection range specifications only by changing the widths W1 and W2.

Such characteristics are very convenient for an element such as a magnetic impedance element or orthogonal fluxgate element whose detection magnetic field range needs to be managed within a certain range from the viewpoint of magnetic saturation or linearity. From the viewpoint of productivity as well, when several types of devices are prepared by changing the width of the inlet/outlet of the primary conductor while fixing the position of the element, it is possible to cope with various kinds of current specifications and greatly contribute to cost reduction of the current sensor.

Figure 32:
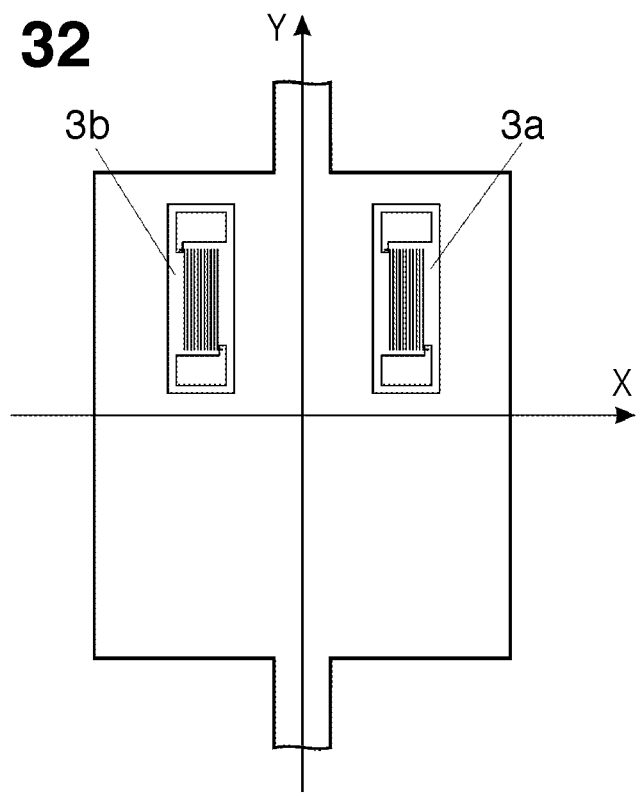
FIG. 32 is a view showing the arrangement of a modification.
Figure 33:
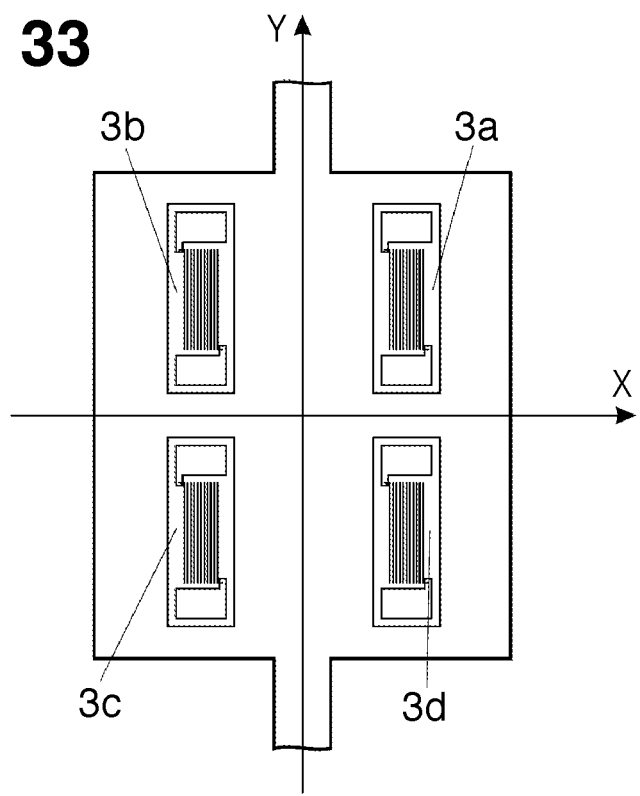
FIG. 33 is a view showing the arrangement of another modification.

Referring to FIG. 27, the magnetic detection elements 3a and 3b are provided in the first and fourth quadrants on the X-Y plane, respectively. However, they may be arranged adjacently in other quadrants because of the symmetry, as a matter of course. FIG. 32 shows an example in which the magnetic detection element 3a is provided in the first quadrant, and the magnetic detection element 3b is arranged in the second quadrant. FIG. 33 shows an example in which magnetic detection elements are provided in all quadrants.

Referring to FIG. 33, in a magnetic detection unit in which four magnetic detection elements 3a to 3d are integrated, detection portions 4a, 4b, 4c, and 4d are arranged in the first, second, third, and fourth quadrants, respectively. When the detection portions 4a, 4b, 4c, and 4d are operated as a bridge arrangement, as shown in FIG. 20, the S/N ratio of the detection circuit 100 can be improved. When the detection portions 4a to 4d are arranged on both sides of origin O to be symmetric about the X- and Y-axes, the vector components Hy are symmetric about the X- and Y-axes.

Hence, differential detection of the outputs of the detection portions 4a and 4d and differential detection of the outputs of the detection portions 4b and 4c concerning the X-axis and differential detection of the outputs of the detection portions 4a and 4b and differential detection of the outputs of the detection portions 4d and 4c concerning the Y-axis can simultaneously be performed. Averaging the detection results allows to further improve the measurement accuracy.

When the inlet 9a and the outlet 9b are located at the center in the widthwise direction of the primary conductor 1, elements adjusted to have the same sensitivity are installed to be symmetric about the X- or Y-axis and differentially operated. The output by the magnetic field from the primary conductor 1 is thus doubled, and the external magnetic field in phase is canceled.

Figure 34:
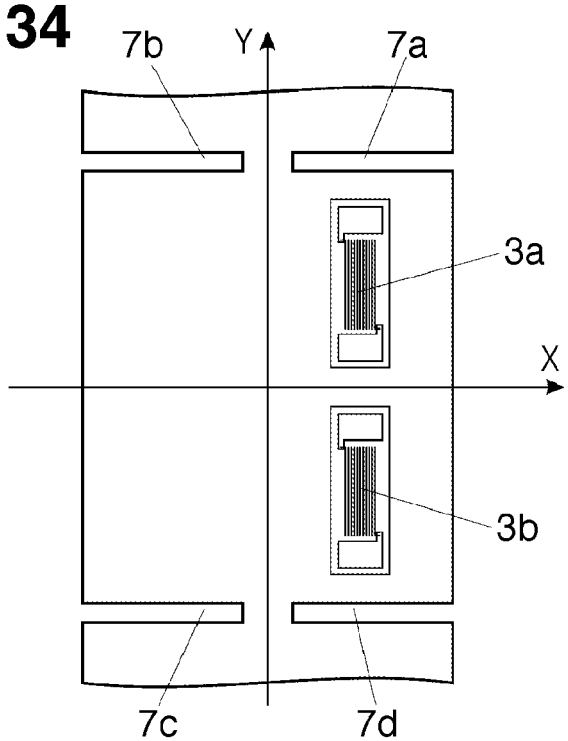
FIG. 34 is a view showing the arrangement of still another modification.

FIG. 34 shows still another modification. If the conductor up to the inlet 9a or the conductor from the outlet 9b is too narrow, a problem of heat generation may arise at the time of application of a large current. To prevent this, the current inlet and outlet are regulated by slit grooves 7a, 7b, 7c, and 7d, as shown in FIG. 34, thereby suppressing heat generation itself and improving thermal diffusion. Note that as can be understood from FIG. 34, when the slit grooves 7a, 7b, 7c, and 7d are formed in the primary conductor 1, the above-described main portion, inlet 9a, and outlet 9b are formed.

<Seventh Embodiment>

Figure 35:
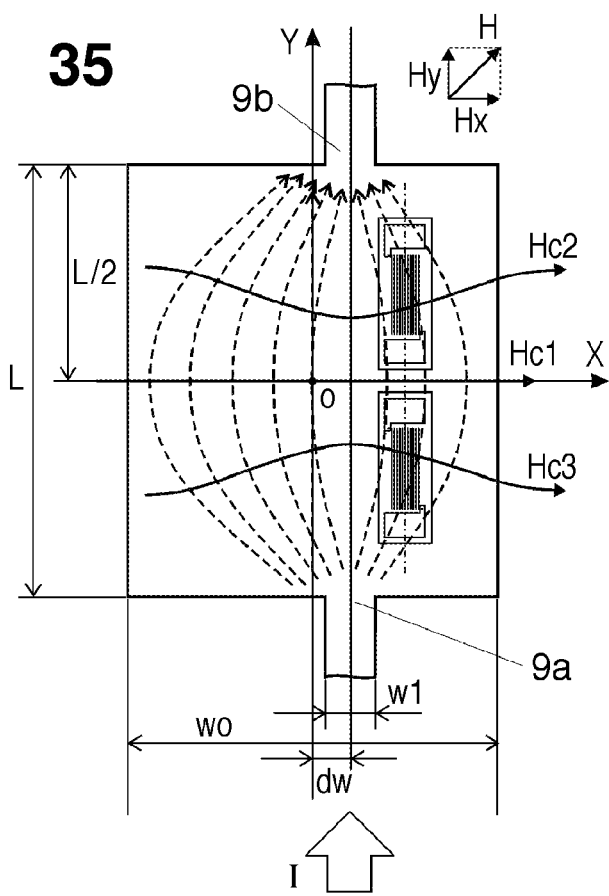
FIG. 35 is a view showing the arrangement of the seventh embodiment.

In the sixth embodiment, when the detection portions 4a and 4b of the magnetic detection elements 3a and 3b are placed near the coordinate positions (2, 2.5) and (2, −2.5), only changing the widths W1 and W2 of the inlet 9a and the outlet 9b enables to cope with the specifications of the measurement target current. As another method, the arrangement positions of an inlet 9a and an outlet 9b may be offset in the widthwise direction of a primary conductor 1. FIG. 35 shows the layout. The inlet 9a and the outlet 9b are shifted by dw in the widthwise direction from the layout shown in FIG. 28. Since the spread of a current changes accordingly, the direction of a magnetic field at the arrangement positions of detection portions 4a and 4b of magnetic detection elements 3a and 3b can be changed.

Figure 36:
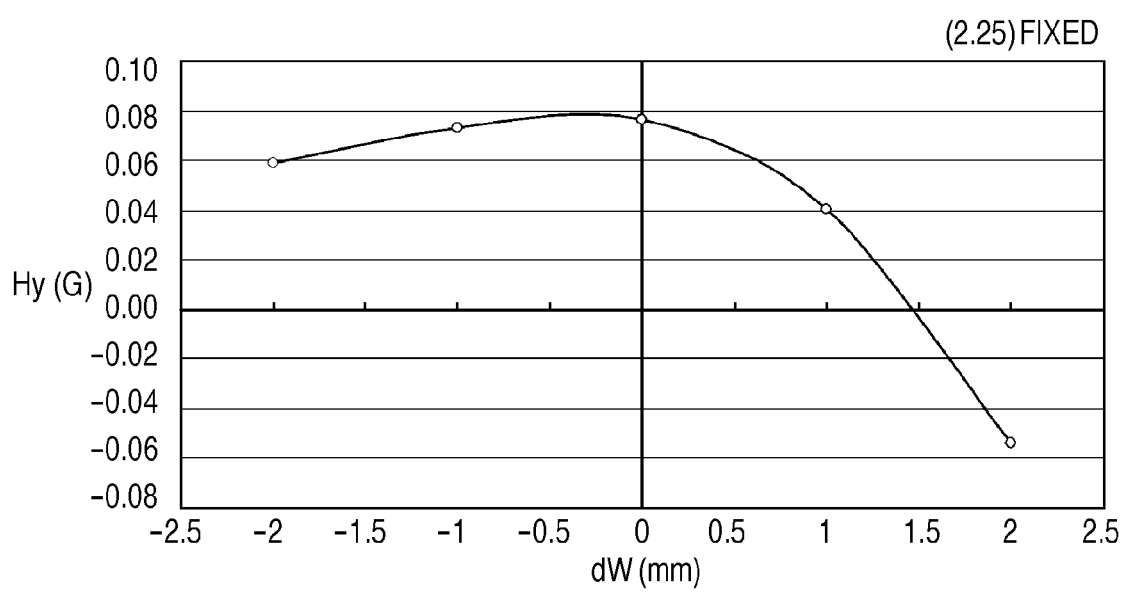
FIG. 36 is a graph showing the relationship between the position of a current inlet/outlet and a Y-axis magnetic field component (fixed point)

FIG. 36 shows the result of a simulation of a Y-axis magnetic field component Hy according to the seventh embodiment. The primary conductor 1 has an X-axis width W0=8 mm and a Z-axis thickness t=0.8 mm. Both widths W1 and W2 of the inlet 9a and the outlet 9b are 1.2 mm. A Y-axis length L of the primary conductor 1 serving as a magnetic detection unit is 7.5 mm. When the inlet 9a and the outlet 9b are located at the center of the width W0, as in the sixth embodiment, the offset amount dw=0. In the seventh embodiment, simulations were conducted for the offset amount dw=−2, −1, 0, 1, and 2 mm.

The coordinate positions of the magnetic detection element 3a is fixed to X=2 mm and Y=2.5 mm. The adjustment margin of the magnetic field of the magnetic field component Hy in the direction in which the current mainly flows is small when the offset amount has a negative value, as shown in FIG. 36. On the other hand, when the offset amount has a positive value, that is, when the distance between the inlet 9a or outlet 9b and the magnetic detection unit shortens, the magnetic field abruptly lowers and reaches the opposite polarity. Hence, the magnetic field component Hy can largely be adjusted in an area where the offset amount has a positive value.

<Eighth Embodiment>

Figure 37:
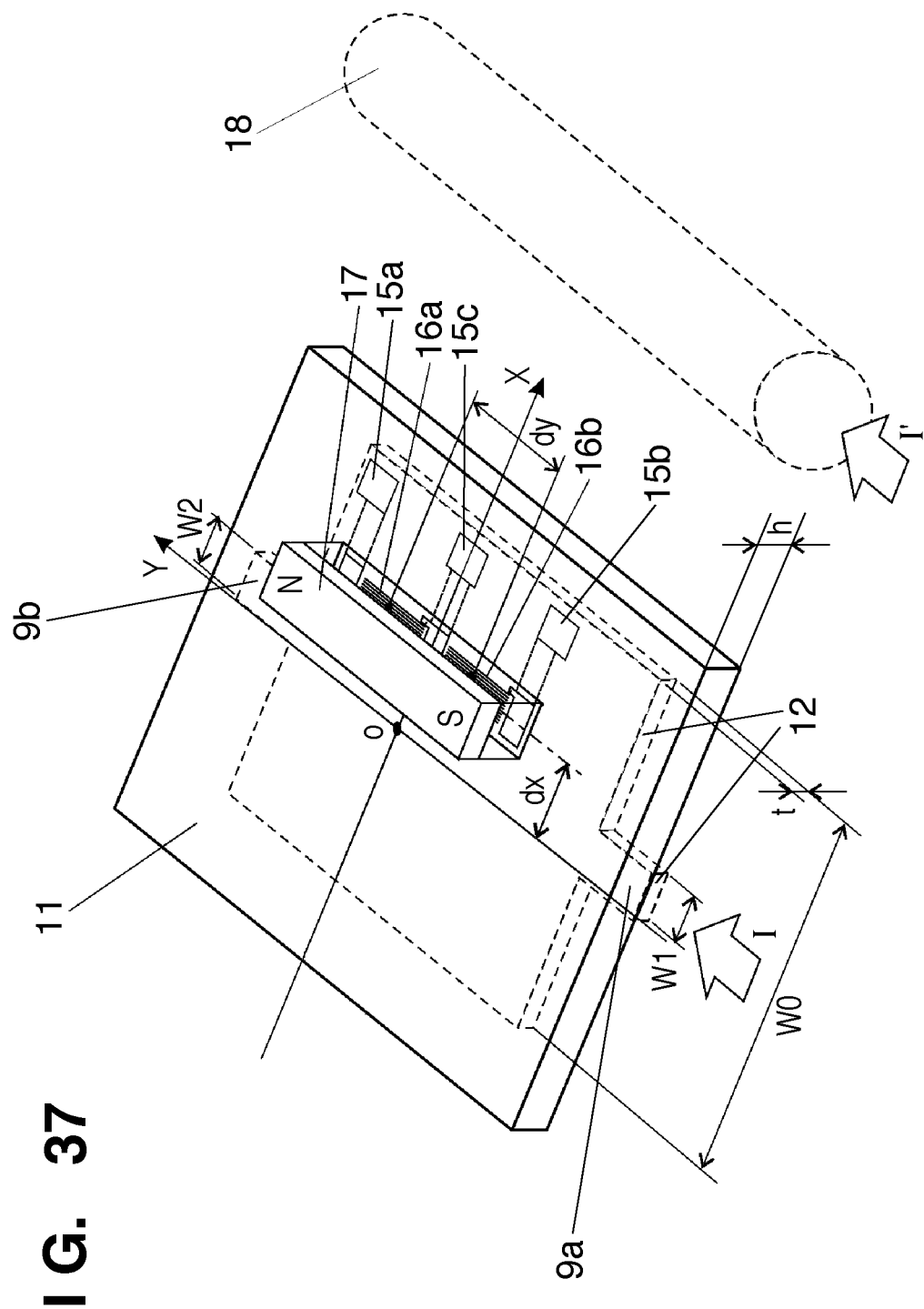
FIG. 37 is a perspective view showing the arrangement of the eighth embodiment.

FIG. 37 is a perspective view showing the arrangement of a current sensor according to the eighth embodiment. A sensor board 11 is made of a glass epoxy material and has a thickness of 1.6 mm. A primary conductor 12 is provided on one surface of the sensor board 11. The primary conductor 12 is formed from a copper pattern having an X-axis width of 8 mm, a Y-axis length of 7.5 mm, and a Z-axis thickness of 70 μm. An origin O of the X- and Y-axes is set at the center of the primary conductor 12.

An inlet 9a and an outlet 9b of the primary conductor 12 are extracted along the Y-axis from the center of a width W in the X-axis direction while having a width W1=W2=1.2 mm. If the inlet 9a and the outlet 9b are extracted long while keeping the width of 1.2 mm, heat generation may occur on a large current side. In an experiment, a cable having a core wire diameter of 1.6 mm was soldered immediately near the inlet 9a and the outlet 9b, and a measurement target current is applied.

A magnetic detection unit 14 that integrates two magnetic detection elements is arranged on the other surface of the sensor board 11. Electrodes 15a to 15c for soldering are extracted from the magnetic detection unit 14 onto the sensor board 11.

A magnetic impedance element is used as the magnetic detection unit 14. Each of detection portions 16a and 16b formed from an Fe—Ta—C-based thin magnetic film includes 11 elongated and juxtaposed patterns each having a width of 18 μm, a thickness of 2.65 μm, and a length of 1.2 mm. The detection portions 16a and 16b have the magnetic field detection direction in the Y-axis direction.

As shown in FIG. 37, the position of each of the detection portions 16a and 16b is offset from the center of a through hole 13 by a distance dx=2 mm in the X-axis direction. A center interval dy between the detection portions 16a and 16b is 5 mm. The magnetic detection unit 14 is thus arranged to be symmetric about the X-axis.

Although not illustrated, the plurality of thin magnetic film patterns of each of the detection portions 16a and 16b are electrically connected in series to form a meandering pattern. The ends of the thin magnetic film patterns connected in series are connected to corresponding electrodes. As shown in FIG. 37, the ends of the thin magnetic film patterns are soldered to the electrodes 15a to 15c on the sensor board 11, and connected to a detection circuit 100. Referring to FIG. 37, a high-frequency pulse is applied to a pair of electrodes 15a and 15c and a pair of electrodes 15b and 15c extracted to the sensor board 11.

The magnetic detection unit 14 has an axis of easy magnetization in the X-axis direction (widthwise direction). When a high-frequency pulse is applied to the thin magnetic film patterns, the impedance is changed by an external magnetic field. The voltage across the magnetic detection unit 14 is converted into a sensor signal by amplitude detection. The differential detection effect can be enhanced by adjusting the bias magnetic field or circuit gain of each element such that no relative difference is generated.

To evaluate the influence of a current other than a measurement target current I that flows in parallel, a copper rod 18 having a diameter of 2 mm was parallelly arranged at an interval of 10 mm from an end of the primary conductor 12. The measurement was performed while supplying a 50-Hz current I' of 10 Arms to the copper rod 18 but supplying no current to the primary conductor 12. The level of the current I'flowing to the copper rod 18 was equal to or lower than the noise level (equal to or lower than 10 mVpp) in the magnetic detection unit 14. A magnetic field from the adjacent parallel current line has only an X- or Z-axis component and no Y-axis component, and the distances between the adjacent copper rod 18 and the detection portions 16a and 16b are equal. For these reasons, it was confirmed that the differential removal function effectively acted, and the influence of the noisy magnetic field was almost completely removed.

Figure 38:
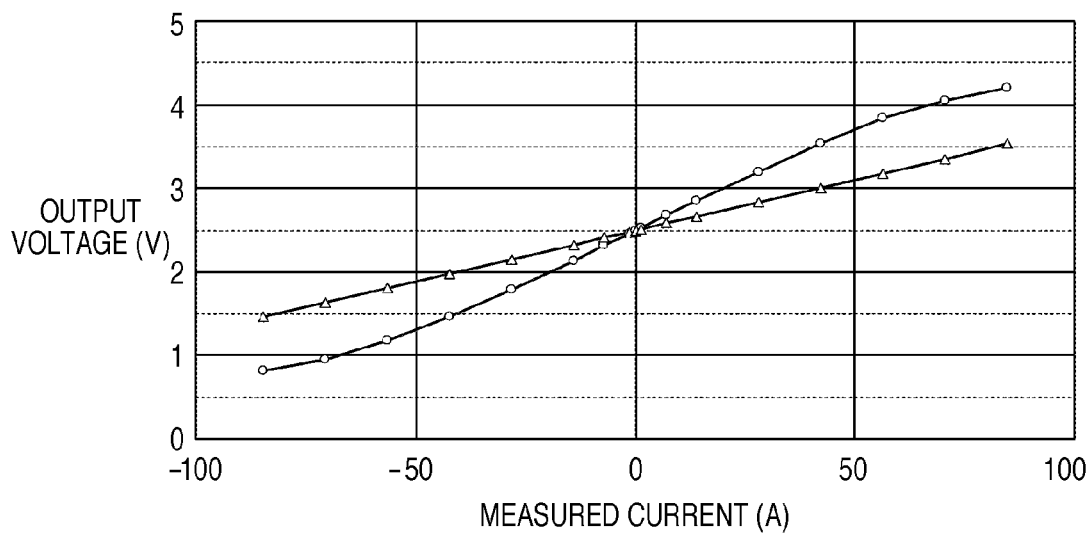
FIG. 38 is a graph showing the relationship between a measured current and an output when the width of an inlet/outlet is changed.

FIG. 38 shows the relationship between a measured current and an output voltage when the width W1 (=W2) of the inlet 9a and the outlet 9b of the primary conductor 1 is changed to 1.2 mm and 4.8 mm. Note that since the detection circuit 100 is driven by a single power supply of 5 V, the output voltage to a measured current of 0 A is adjusted to 2.5 V.

As shown in FIG. 31, a magnetic field Hy in the Y direction applied to the element is 0.078 gauss per 1 A. In the above-described sensor whose linearity is ensured in the range of ±3 gauss, the linearity degrades beyond ±38.5 A. Even in the actual measured data shown in FIG. 38, beyond about 40 A the linearity decreases as can be seen. Under this condition, the current is ±40 A in the specifications.

To widen the range with excellent linearity, the widths of the inlet 9a and the outlet 9b are increased. When the widths W1 and W2 are changed to 4.8 mm, the magnetic field Hy is 0.038 gauss per 1 A. The linearity is ensured up to ±79 A. Even in the actual measured data, the linearity is ensured up to ±80 A, as can be seen. The sensitivity difference is adjusted by the gain of differential amplification.

This means that changing only the width of the current inlet/outlet while using the same magnetic detection unit and circuit arrangement allows to ensure the linearity within a desired measured current range.

Figure 39:
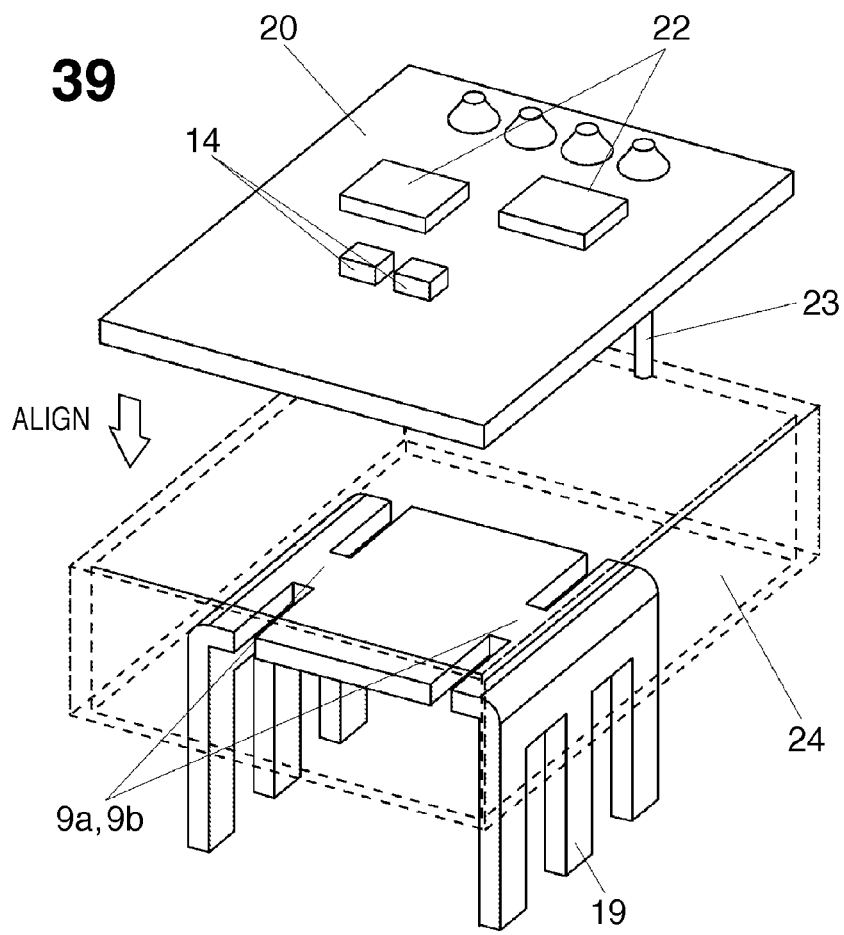
FIG. 39 is a view showing the arrangement of a modification.

The eighth embodiment assumes an example in which the primary conductor 12 is arranged on the sensor board 11. However, when the primary conductor is a bus bar 19 formed from a copper plate, as indicated by a modification shown in FIG. 39, a sensor board 20 on which the magnetic detection unit and the electric components and terminals of the processing circuit are mounted can be aligned to form a module. The ends of the bus bar 19 are worked thinly so that they can be inserted into the partner board and soldered. As for holding of the magnetic detection unit 14, it is assembled to a nonconductive member 24 such as a resin mold member, thereby ensuring both the position accuracy and the insulating properties, as is simply illustrated.

Note that reference numeral 22 denotes a circuit element provided on the sensor board 20; and 23, a terminal that connects the signal of the magnetic detection unit 14 to another circuit board.

With this arrangement, only preparing several types of bus bars 19 by changing the width or position of a notch portion serving as an inlet/outlet 21 of the current detection unit makes it possible to cope with a variety of current specifications and ensure the flexibility of products.

As described above, as one characteristic feature of the present invention, a direction change area that changes the flowing direction of a measurement target current from the main direction to another direction is provided at part of a conductor to which the measurement target current flows. As another characteristic feature of the present invention, a magnetic detection element detects a magnetic field generated by the measurement target current whose flowing direction is changed by the direction change area. With this arrangement, the device is hardly affected by a magnetic field generated by a current flowing to another conductor arranged in parallel to the primary conductor serving as a current measurement target. That is, the current measurement accuracy can be improved.

As the direction change area, a nonconductive area that impedes the current flow is used. In the above-described embodiments, a hole is employed as the nonconductive area. A nonconductive member such as an insulator may be inserted into the hole. Not a through hole but a blind hole may be used. When forming a blind hole in place of a through hole, the portion that forms the bottom of the hole needs to be sufficiently thin relative to the depth of the hole so that the direction of the magnetic field can sufficiently be changed.

Since the current changes to a bypass current that bypasses the nonconductive area, the magnetic field is distorted near the nonconductive area. Especially, when the magnetic detection element having the magnetic field detection sensitivity is arranged only in the main direction (Y-axis direction) of the current, the device is not affected by the magnetic field in another direction such as the X-axis direction. Hence, the measurement accuracy is improved.

To improve the measurement accuracy, a plurality of magnetic detection elements may be used. For example, two magnetic detection elements may be arranged to be line-symmetric about the Y-axis passing through the center of the primary conductor, or two magnetic detection elements may be arranged to be line-symmetric about the X-axis. These arrangements may be combined to arrange a total of four magnetic detection elements.

Note that as can be seen from experimental results, when the detection portion of the magnetic detection element is arranged within the range spaced apart from the center of the nonconductive area by 0.5 to 2.5 mm along the X- and Y-axes, the measurement accuracy is improved.

As the direction change area, the main portion of the primary conductor to which the current flows may be provided with the outlet 9b having the width W2 smaller than the width W0 of the main portion and the inlet 9a having the width W2 smaller than the width W0 of the main portion and arranged on the rear side of the main portion. Note that only one of the inlet 9a and the outlet 9b may be arranged on the main portion, although the accuracy lowers. Note that the arrangement positions and the number of magnetic detection elements may be almost the same as the arrangement positions and the number of nonconductive areas.

The degree of freedom of design is also high because the detection range of the measurement target current can easily be adjusted only by changing the size of the nonconductive area.

The present invention is not limited to the above embodiments and various changes and modifications can be made within the spirit and scope of the present invention. Therefore, to apprise the public of the scope of the present invention, the following claims are made.

This application claims the benefit of Japanese Patent Application No. 2010-071362, filed Mar. 26, 2010, and Japanese Patent Application No. 2010-238564, filed Oct. 25, 2010, and which are hereby incorporated by reference herein in their entirety.

What is claimed is:

1. A current measurement method comprising steps of:
providing, at part of a conductor to which a measurement target current flows in a first direction, a nonconductive area which the measurement target current does not flow that generates a component in the first direction in a magnetic field raised by the measurement target current by the nonconductive area changing a flowing direction of the measurement target current from the first direction to another direction;
arranging a magnetic detection element near the nonconductive area such that a direction in which the magnetic detection element detects the magnetic field is in the first direction;
causing the magnetic detection element to detect a magnetic field generated by the measurement target current whose flowing direction is changed by the nonconductive area, the magnetic field being a magnetic field component of a bypass current flowing outside the nonconductive area, which is directed in the first direction of the measurement target current; and
estimating an amount of the measurement target current from an output of the magnetic detection element.

2. The current measurement method according to claim 1, further comprising:
arranging another magnetic detection element to be symmetric with respect to the magnetic detection element about an axis perpendicular to an axis in the first direction and passing through a center of the nonconductive area; and
causing the another magnetic detection element to detect a magnetic field component of the bypass current in the first direction,
wherein the magnetic detection element and the another magnetic detection element detect magnetic field components that have different polarities.

3. The current measurement method according to claim 1, further comprising:
arranging another magnetic detection element to be symmetric with respect to the magnetic detection element about an axis parallel to an axis in the first direction and passing through a center of the nonconductive area; and
causing the another magnetic detection element to detect a magnetic field component of the bypass current in the first direction,
wherein the magnetic detection element and the another magnetic detection element detect magnetic field components that have different polarities.

4. The current measurement method according to claim 1, further comprising:
arranging another magnetic detection element, to be symmetric with respect to the magnetic detection element about an axis perpendicular to the first direction and passing through a center of the nonconductive area;
causing the another magnetic detection element to detect a magnetic field component of the bypass current in the first direction, wherein the magnetic detection element and the another magnetic detection element detect magnetic field components that have different polarities;
arranging a third magnetic detection element and a fourth magnetic detection element to be symmetric about an axis parallel to the first direction and passing through the center of the nonconductive area; and
causing the third magnetic detection element and the fourth magnetic detection element to detect magnetic field components of the bypass current in the first direction, wherein the third magnetic detection element and the fourth magnetic detection element detect magnetic field components that have different polarities.

5. The current measurement method according to claim 2, further comprising:
arranging a detection portion of the magnetic detection element within a range spaced apart from a center of the nonconductive area by 0.5 to 2.5 mm along an X-axis and a Y-axis,
wherein the center of the nonconductive area is an origin, the first direction of the measurement target current is the Y-axis, and a direction perpendicular to the Y-axis is the X-axis.

6. The current measurement method according to claim 1, further comprising:
providing, as a direction change area, an outlet having a width smaller than a width of a main portion of the conductor on a front side of the conductor to which the measurement target current flows in the first direction, and an inlet having a width smaller than a width of the conductor on a rear side of the conductor.

7. The current measurement method according to claim 6, further comprising:
offsetting the magnetic detection element from a center of the conductor in the first direction and in a direction perpendicular to the first direction.

8. The current measurement method according to claim 7, further comprising:

arranging, on the conductor, at least two magnetic detection elements on both sides of a line that connects the outlet and the inlet.

9. The current measurement method according to claim 7, further comprising:
arranging, on the conductor, at least two magnetic detection elements on both sides of a line perpendicular to the first direction.

10. The current measurement method according to claim 7, further comprising:
arranging, on the conductor, at least two magnetic detection elements, with at least one of the two magnetic detection elements on each side a line perpendicular to the first direction and
arranging, on the conductor, another at least two magnetic detection elements, with at least one of the other two magnetic detection elements on each side of a line parallel to the first direction.

11. The current measurement method according to claim 1, wherein the step of arranging at least one magnetic detection element on the conductor includes a step of arranging one of a magnetic impedance element and an orthogonal fluxgate element as the magnetic detection element.

12. A current measurement device, comprising:
a conductor to which a measurement target current flows in a first direction;
a nonconductive area provided at part of said conductor which the measurement target current does not flow, wherein the nonconductive area is configured to generate a component in the first direction in a magnetic field raised by the measurement target current by changing a flowing direction of the measurement target current from the first direction to another direction;
a magnetic detection element arranged on said conductor; and
an estimation circuit that estimates an amount of the measurement target current from an output of said magnetic detection element that has detected a magnetic field generated by the measurement target current whose flowing direction is changed by said nonconductive area,
wherein said magnetic detection element is arranged near the nonconductive area such that a direction in which said magnetic detection element detects the magnetic field is in the first direction, and
wherein said magnetic detection element is configured to detect a magnetic field component of a bypass current flowing outside the nonconductive area, which is directed in the first direction of the measurement target current.

13. The current measurement device according to claim 12, further comprising:
another magnetic detection element arranged to be symmetric with respect to said magnetic detection element about an axis perpendicular to an axis in the first direction and passing through a center of the nonconductive area,
wherein said another magnetic detection element is configured to detect a magnetic field component of the bypass current in the first direction, and
wherein said magnetic detection element and said another magnetic detection element are configured to detect magnetic field components that have different polarities.

14. The current measurement device according to claim 12, further comprising:

another magnetic detection element arranged to be symmetric with respect to said magnetic detection element about an axis parallel to the first direction and passing through a center of the nonconductive area,
wherein said another magnetic detection element is configured to detect a magnetic field component of the bypass current in the first direction, and
wherein said magnetic detection element and said another magnetic detection element are configured to detect magnetic field components that have different polarities.

15. The current measurement device according to claim 12, further comprising:
another magnetic detection element arranged to be symmetric with respect to said magnetic detection element about an axis perpendicular to the first direction and passing through a center of the nonconductive area;
a third magnetic detection element and
a fourth magnetic detection element, wherein said third magnetic detection element and said fourth magnetic detection element are arranged to be symmetric about an axis parallel to the first direction and passing through the center of the nonconductive area.

16. The current measurement device according claim 13, wherein the center of the nonconductive area is defined as an origin, the first direction of the measurement target current is defined as a Y-axis, and a direction perpendicular to the Y-axis is defined as an X-axis, and a detection portion of said magnetic detection element is arranged within a range spaced apart from the center of the nonconductive area by 0.5 to 2.5 mm along the X-axis and the Y-axis.

17. The current measurement device according to claim 12, wherein a direction change area includes an outlet having a width smaller than a width of a main portion of said conductor and provided on a front side of said conductor to which the measurement target current flows in the first direction, and an inlet having a width smaller than a width of said conductor and provided on a rear side of said conductor.

18. The current measurement device according to claim 17, wherein said magnetic detection element is arranged offset from a center of said conductor in the first direction and in a direction perpendicular to the first direction.

19. The current measurement device according to claim 18, wherein at least two magnetic detection elements are arranged on said conductor on both sides of a line that connects said outlet and said inlet.

20. The current measurement device according to claim 18, wherein at least two magnetic detection elements are arranged on said conductor on both sides of a line perpendicular to the first direction.

21. The current measurement device according to claim 18, further comprising:
another magnetic detection element, wherein said magnetic detection element and said another magnetic detection element are arranged on said conductor on opposites sides of a line perpendicular to the first direction;
a third magnetic detection element; and
a fourth magnetic detection element, wherein said third magnetic detection element and said fourth magnetic detection element are arranged on said conductor on opposite sides of a line parallel to the first direction.

22. The current measurement device according to claim 12, wherein said magnetic detection element includes one of a magnetic impedance element and an orthogonal fluxgate element.

* * * * *